United States Patent
Yang et al.

(10) Patent No.: US 12,027,554 B2
(45) Date of Patent: Jul. 2, 2024

(54) COMPOSITE DEEP TRENCH ISOLATION STRUCTURE IN AN IMAGE SENSOR

(71) Applicant: Taiwan Semiconductor Manufacturing Co., Ltd., Hsinchu (TW)

(72) Inventors: Che Wei Yang, Hsinchu (TW); Sheng-Chan Li, Tainan (TW); Tsun-Kai Tsao, Tainan (TW); Chih-Cheng Shih, Hsinchu (TW); Sheng-Chau Chen, Tainan (TW); Cheng-Yuan Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 451 days.

(21) Appl. No.: 17/144,757

(22) Filed: Jan. 8, 2021

(65) Prior Publication Data
US 2022/0223634 A1  Jul. 14, 2022

(51) Int. Cl.
*H01L 27/146* (2006.01)

(52) U.S. Cl.
CPC .... *H01L 27/1463* (2013.01); *H01L 27/14627* (2013.01); *H01L 27/14636* (2013.01); *H01L 27/14643* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 2005/0012131 A1* | 1/2005 | Chen | H01L 29/66181 257/E21.396 |
| 2007/0045513 A1 | 3/2007 | Lee et al. | |
| 2014/0061842 A1 | 3/2014 | Ting et al. | |
| 2017/0062512 A1* | 3/2017 | Chou | H01L 27/1463 |
| 2017/0077157 A1 | 3/2017 | Cheng et al. | |
| 2017/0084646 A1* | 3/2017 | Yang | H01L 27/1463 |

(Continued)

FOREIGN PATENT DOCUMENTS

TW  I528536 B  4/2016

OTHER PUBLICATIONS

Aptina Imaging Corporation. "An Objective Look at FSI and BSI." Published in 2010.

(Continued)

*Primary Examiner* — Ali Naraghi
(74) *Attorney, Agent, or Firm* — Eschweiler & Potashnik, LLC

(57) ABSTRACT

In some embodiments, the present disclosure relates to an integrated chip that includes a first image sensing element and a second image sensing element arranged over a substrate. A first micro-lens is arranged over the first image sensing element, and a second micro-lens is arranged over the second image sensing element. A composite deep trench isolation structure is arranged between the first and second image sensing elements. The composite deep trench isolation structure includes a lower portion arranged over the substrate and an upper portion arranged over the lower portion. The lower portion includes a first material, and the upper portion includes a second material that has a higher reflectivity than the first material.

20 Claims, 18 Drawing Sheets

(56) References Cited

U.S. PATENT DOCUMENTS

2020/0013820 A1\* 1/2020 Rideau ................ H01L 27/1462
2021/0193706 A1\* 6/2021 Kim .................. H01L 27/14689

OTHER PUBLICATIONS

Scientist Live. "A Comparison Between Back and Front Illuminated Sensors." Published on Jun. 7, 2019.
Guissi, Sofiane. "CMOS Image Sensors (CIS): Past, Present & Future." Published on Jun. 14, 2017.
Wikipedia.org. "Back-Illuminated Sensor." Published on Sep. 21, 2020.

\* cited by examiner

COMPOSITE DEEP TRENCH ISOLATION STRUCTURE IN AN IMAGE SENSOR

BACKGROUND

Many modern day electronic devices, such as digital cameras and video cameras, contain image sensors to convert optical images to digital data. To achieve this, an image sensor comprises an array of pixel regions. Each pixel region contains a photodiode configured to capture optical signals (e.g., light) and convert it to digital data (e.g., a digital image). Complementary metal-oxide-semiconductor (CMOS) image sensors (CIS) are often used over charge-coupled device (CCD) image sensors because of their many advantages, such as lower power consumption, faster data processing, and lower manufacturing costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
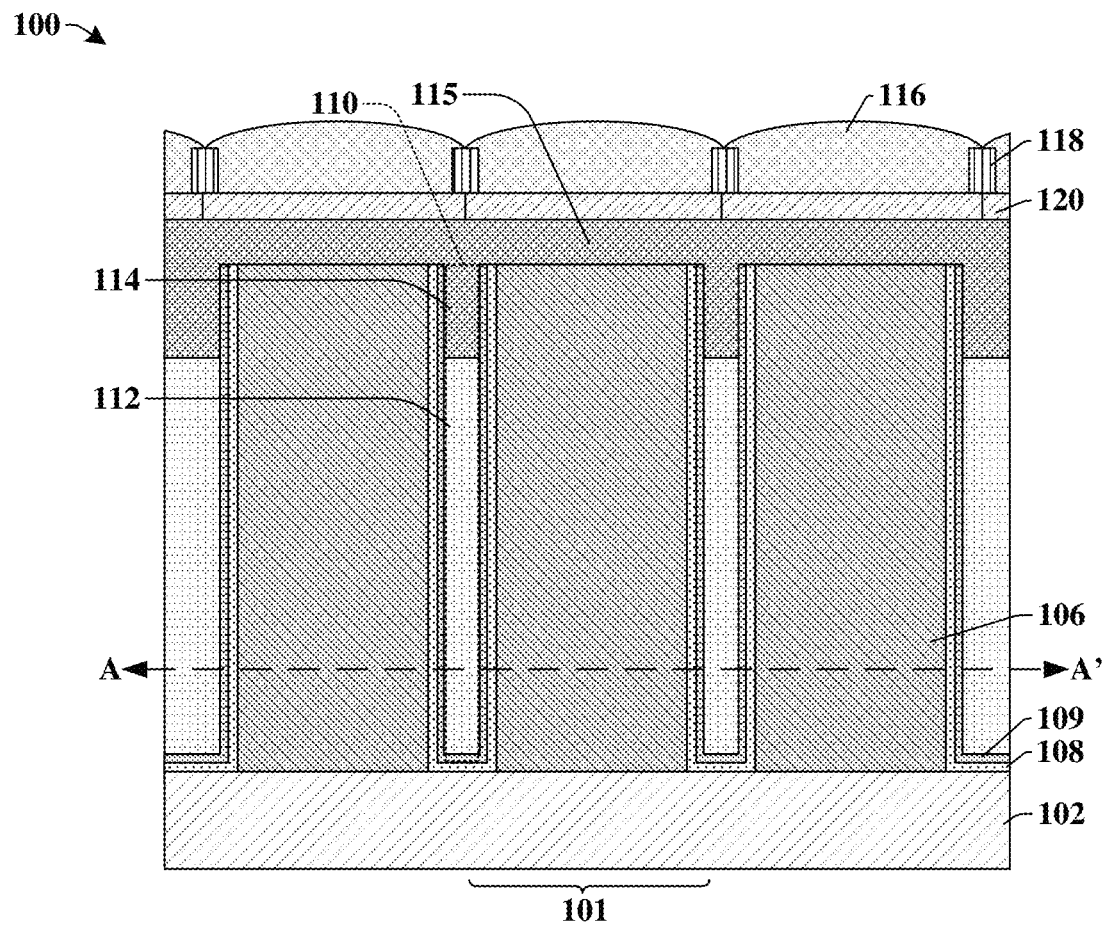
FIG. 1 illustrates a cross-sectional view of some embodiments of a CMOS image sensor comprising multiple pixel regions, wherein each pixel region is spaced apart by a composite deep trench isolation structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary metal-oxide-semiconductor (CMOS) image sensor (CIS) may include a plurality of pixel regions arranged on or within a substrate. Each pixel region comprises an image sensing element, such as a photodiode, that is configured to receive incident light comprising photons. Upon receiving light, the image sensing element is configured to convert the light into electric signals which are processed by circuitry to determine an image captured by the CIS. In a backside illumination (BSI) CIS, the image sensing elements are arranged over an interconnect structure such that incident light travels through the image sensing elements, is converted to an electric signal, and enters and travels through the interconnect structure. In a frontside illumination (FSI) CIS, the image sensing elements are arranged below an interconnect structure. The interconnect structure may be coupled to various devices (e.g., transistors, processing circuitry, capacitors, etc.) to process the electric signals.

The pixel regions may be separated from one another by a deep trench isolation structure to improve the quantum efficiency of the CIS. Quantum efficiency (QE) is a ratio of a number of photons that contribute to an electric signal generated by an image sensing element within a pixel region to a number of photons incident on the pixel region. Often, the deep trench isolation structure comprises a dielectric material that has low reflectivity such that incident light does not reflect off of the deep trench isolation structure and out of the image sensing element, away from image sensing element. However, with a deep trench isolation structure comprising a dielectric and low-reflective material, cross-talk between pixel regions may occur. When cross-talk is increased due to light escaping an image sensing element through the deep trench isolation structure, the number of photons that contribute to the electric signal decreases, thereby decreasing the QE of the pixel region.

Various embodiments of the present disclosure relate to a CMOS image sensor comprising a composite deep trench isolation structure that comprises an upper portion arranged over a lower portion, wherein the upper portion comprises a less reflective material than the lower portion. In some embodiments, the upper portion comprises a dielectric material, and the lower portion comprises a metal. Because the upper portion comprises a dielectric material with a low reflectivity, incident light does not immediately reflect out of the pixel region. Because the lower portion comprises a metal with a high reflectivity, traveling light reflects off of the lower portion and towards the interconnect structure instead of escaping from the pixel region and into another pixel region, and thus, the lower portion reduces cross-talk. Because the upper and lower portions of the composite deep trench isolation structure aid in directing light towards processing circuitry and prevent light from escaping an image sensing element, the QE and reliability of the CMOS image sensor is improved.

FIG. 1 illustrates a cross-sectional view 100 of some embodiments of an integrated chip comprising a CMOS image sensor wherein a composite deep trench isolation structure is arranged between image sensing elements of the image sensor.

In some embodiments, the image sensor of FIG. 1 comprises multiple pixel regions 101 arranged over a substrate 102. Each pixel region 101 comprises, in some embodiments, a micro-lens 116 is arranged over each image sensing element 106. In some embodiments, the image sensing elements 106 are configured to convert incident radiation (e.g., photons) that enters through the micro-lens 116 into an electric signal (i.e., to generate electron-hole pairs from the incident radiation). In some embodiments, the image sensing element 106 may comprise a photodiode, a phototransistor, or the like.

In some embodiments, a passivation layer 108 is arranged on outer sidewalls of the image sensing elements 106. In some embodiments, a barrier layer 109 is arranged on the passivation layer 108. In some embodiments, the passivation layer 108 comprises for example, tantalum oxide, titanium oxide, or the like. In some embodiments, the barrier layer 109 is a diffusion barrier layer to prevent metal from diffusion into the image sensing element 106. In some such embodiments, the barrier layer 109 may comprise, for example, titanium nitride, tantalum nitride, or some other diffusion barrier material.

In some embodiments, a composite deep trench isolation structure 110 is arranged between the image sensing elements 106. In some embodiments, the composite deep trench isolation structure 110 comprises a lower portion 112 and an upper portion 114 arranged over the lower portion 112. In some embodiments, the lower portion 112 of the composite deep trench isolation structure 110 comprises a first material, and the upper portion 114 of the composite deep trench isolation structure 110 comprises a second material that has a lower reflectivity than the first material.

For example, in some embodiments, the first material of the lower portion 112 comprises a metal with a high reflectivity, such as, for example, copper, aluminum, tantalum, titanium, tungsten, or the like. The reflectance of a material, which is a measure of the reflectivity, may depend on the wavelength of the incident light. The reflectance is a measurement of the amount of light reflected from a material compared to the amount of light incident to the material. In some embodiments, the lower portion 112 of the composite deep trench isolation structure 110 comprises aluminum or aluminum copper because aluminum and aluminum copper have a high reflectance and have little variation in reflectance values as the wavelength of incident light changes. In some embodiments, the second material of the upper portion 114 of the composite deep trench isolation structure 110 comprises, for example, an oxide (e.g., silicon dioxide), a nitride (e.g., silicon nitride), or some other suitable dielectric material with a lower reflectivity than the first material of the composite deep trench isolation structure 110. Because the reflectance of a material may depend on the wavelength of the incident light, at a given wavelength of incident light, the second material of the upper portion 114 of the composite deep trench isolation structure 110 has a lower reflectance than the first material of the lower portion 112 of the composite deep trench isolation structure. In some embodiments, a ratio of the reflectance of the first material of the lower portion 112 to the reflectance of the second material of the upper portion 114 is in a range of between, for example, approximately 2 to approximately 9.

In some embodiments, an upper isolation layer 115 is arranged directly over the image sensing elements 106 and the composite deep trench isolation structure 110. In some embodiments, the upper isolation layer 115 also comprises the second material and is continuously connected to the upper portion 114 of the composite deep trench isolation structure 110. In some embodiments, micro-lens isolation structures 118 are arranged between the micro-lenses 116 to help guide incident light toward the image sensing element 106. In some embodiments, color filters 120 are arranged between the micro-lenses 116 and the upper isolation layer 115 such that each pixel region 101 analyzes certain colors from the incident light.

In some embodiments, the upper portion 114 of the composite deep trench isolation structure 110 and the upper isolation layer 115 comprise the second material with a low reflectivity such that incident light does not immediately reflect off of the upper isolation layer 115 and the upper portion 114 and travel out of the pixel region 101. Thus, the second material of the upper portion 114 and the upper isolation layer 115 increase the percent of incident light that enters the image sensing element 106 of the pixel region 101. In some embodiments, the lower portion 112 of the composite deep trench isolation structure 110 comprises the second material with a higher reflectivity than the first material to prevent light from traveling into other image sensing elements 106. Thus, by increasing the intensity of incident light received by the image sensing element 106 and by preventing cross-talk between image sensing elements 106, the composite deep trench isolation structure 110 increases the quantum efficiency of the pixel regions 101 of the CMOS image sensor.

Figure 2:
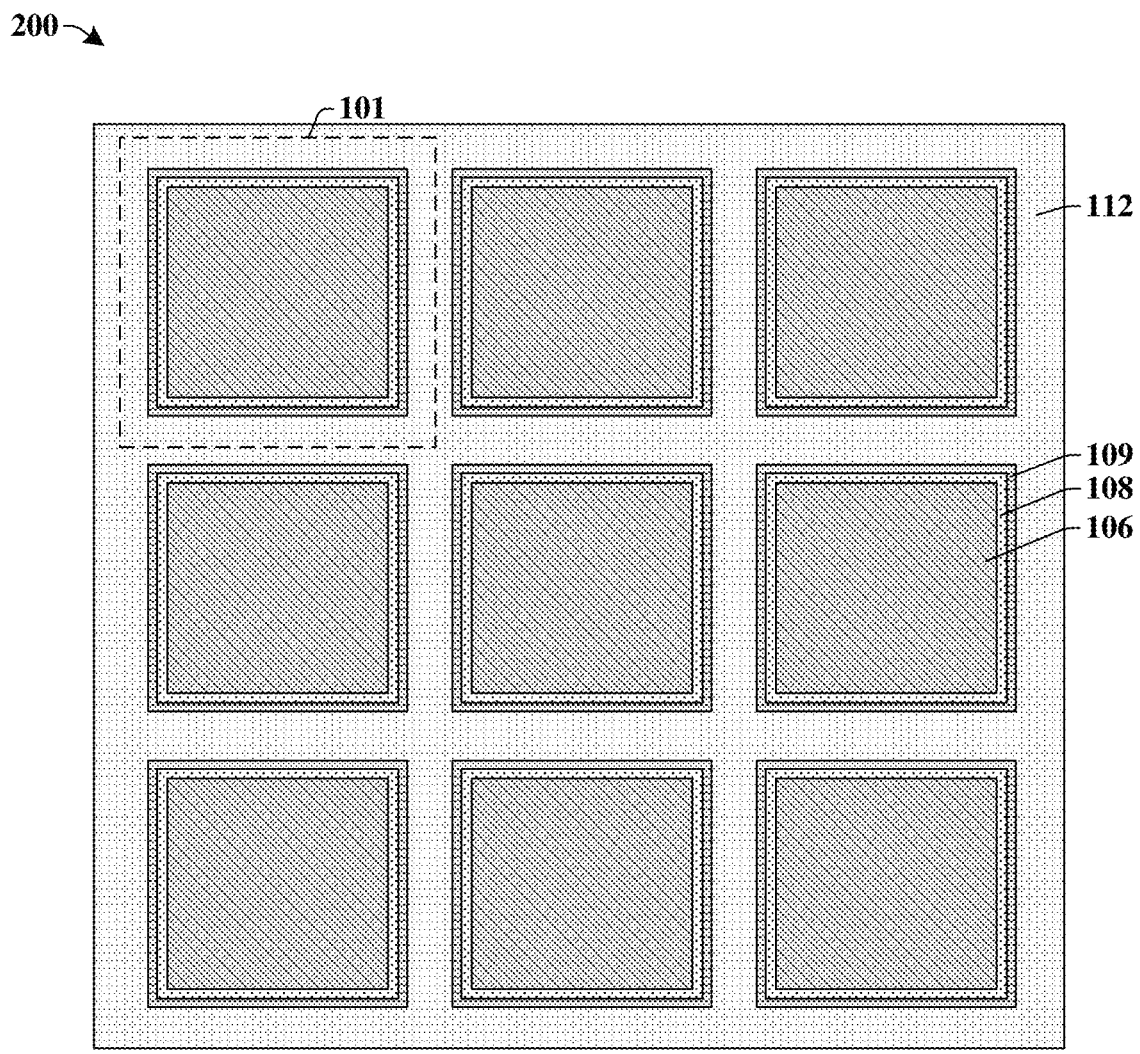
FIG. 2 illustrates a top-view of some embodiments of a CMOS image sensor comprising multiple pixel regions spaced apart from one another by a composited deep trench isolation structure.

FIG. 2 illustrates a top-view 200 of some embodiments of a CMOS image sensor comprising an array of pixel regions spaced apart from one another by a composite deep trench isolation structure.

In some embodiments, the top-view 200 of FIG. 2 corresponds to cross-section line AA' of the cross-sectional view 100 of FIG. 1. Thus, the top-view 200 of FIG. 2 shows the lower portion 112 of the composite deep trench isolation structure (110 of FIG. 1) and does not show the upper portion (114 of FIG. 1) of the composite deep trench isolation structure (110 of FIG. 1). In some embodiments, the image sensing elements 106 have a square profile from the top-view 200. In some other embodiments, the image sensing elements 106 may have a circular, rectangular, or some other shaped profile from the top-view 200. In some embodiments, the passivation layer 108 continuously surrounds outer sidewalls of each image sensing element 106. Similarly, in some embodiments, the barrier layer 109 continuously surrounds outer sidewalls of the passivation layer 108.

Further, in some embodiments, the composite deep trench isolation structure (110 of FIG. 1), which corresponds to the lower portion 112, continuously surrounds the image sensing elements 106 and is a continuously connected structure. Thus, from the top-view 200, the image sensing elements 106, the passivation layer 108, and the barrier layer 109 are embedded within a same composite deep trench isolation structure (110 of FIG. 1). Because the composite deep trench isolation structure (110 of FIG. 1) continuously surrounds the image sensing elements 106, the pixel regions 101 may be arranged in an array and still stay optically and electrically isolated from one another to increase the quantum efficiency of the CMOS image sensor.

Figure 3A:
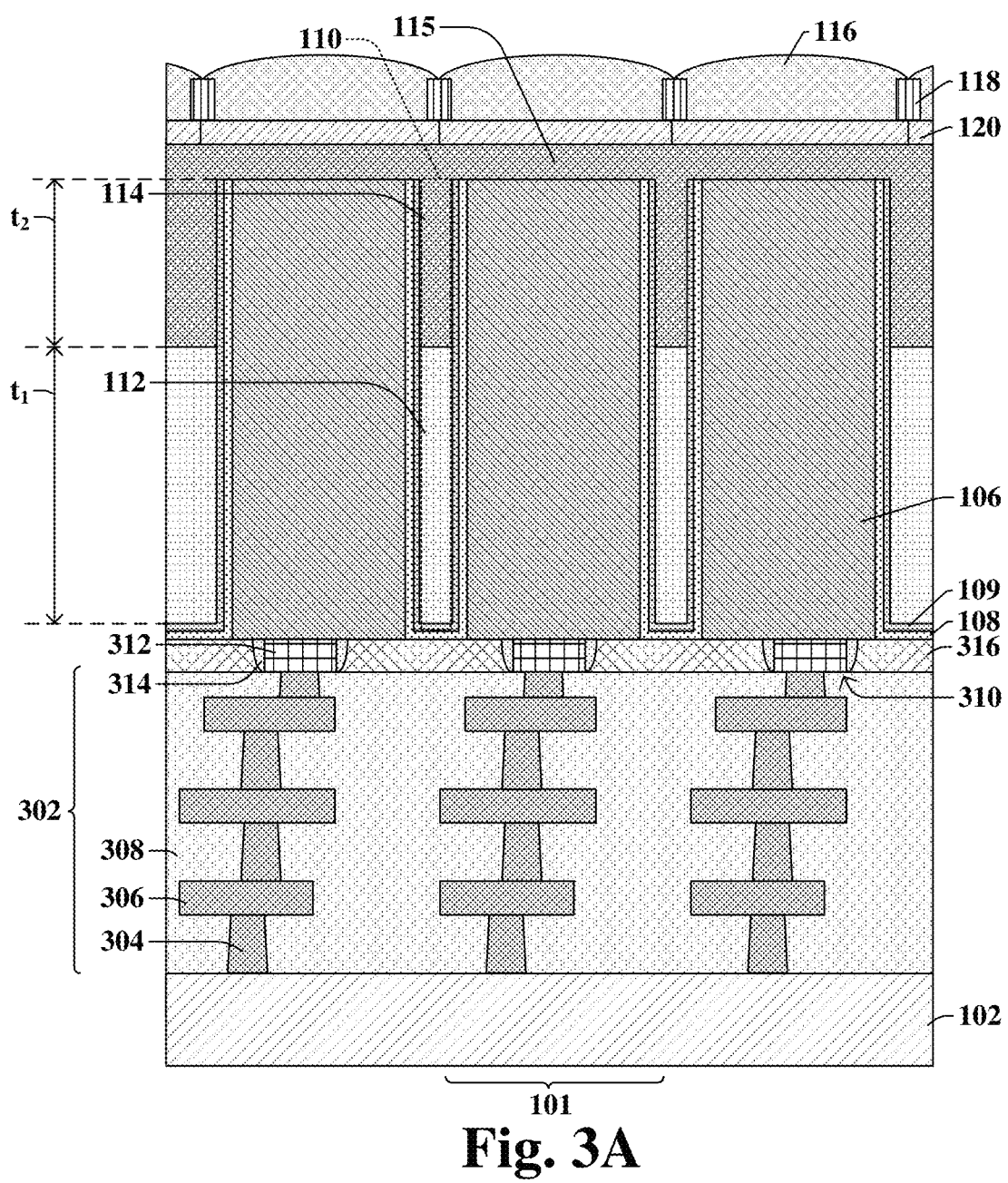
FIG. 3A illustrates a cross-sectional view of some embodiments of a backside illumination (BSI) image sensor comprising multiple pixel regions arranged over an interconnect structure, wherein each pixel region is spaced apart by a composite deep trench isolation structure.

FIG. 3A illustrates a cross-sectional view 300 of some embodiments of a backside illumination (BSI) CMOS image sensor comprising a composite deep trench isolation structure arranged over and coupled to an interconnect structure.

In some embodiments, a BSI image sensor comprises an interconnect structure 302 arranged between the substrate 102 and the image sensing elements 106. In some embodiments, the interconnect structure 302 comprises networks of interconnect wires 306 and interconnect vias 304 arranged within an interconnect dielectric structure 308. In some embodiments, the interconnect wires 306 and the interconnect vias 304 are coupled to transistor gate structures 310. In some embodiments, the transistor gate structures 310 comprise a gate spacer structure 314 surrounding a gate electrode 312. In some embodiments, the transistor gate structures 310 extend through a lower isolation structure 316. In some embodiments, each image sensing element 106 is arranged on one of the transistor gate structures 310, and incident light that enters the image sensing element 106 through the micro-lens 116 may be transferred into an electrical signal that exits the image sensing element 106 through the transistor gate structures 310. The electrical signal may travel to other devices to process the electrical signal through the interconnect wires 306 and the interconnect vias 304. Thus, in some embodiments, devices (e.g., transistors, capacitors, memory storage devices, etc.) may be arranged on or within the substrate 102. In some other embodiments, the substrate 102 may be bonded to another integrated chip such that devices (e.g., transistors, capacitors, memory storage devices, etc.) are arranged below the substrate 102. The interconnect structure 302 and other devices coupled to the image sensing elements 106 make up processing circuitry configured to analyze the image received by the CMOS image sensor.

In some embodiments, the lower portion 112 of the composite deep trench isolation structure 110 has a first thickness $t_1$ measured between bottommost and topmost surfaces of the lower portion 112 of the composite deep trench isolation structure 110. In some embodiments, the upper portion 114 of the composite deep trench isolation structure 110 has a second thickness $t_2$ measured between a bottommost surface of the upper portion 114 and a topmost surface of the image sensing element 106. In some embodiments, the first thickness $t_1$ is greater than or equal to the second thickness $t_2$. Thus, in some embodiments, a ratio of the first thickness $t_1$ to a sum of the first and second thicknesses $t_1$, $t_2$ is in a range of about 50 percent to about 100 percent to optimize the quantum efficiency of the BSI image sensor. In some embodiments, the second thickness $t_2$ is greater than zero, such that the upper portion 114 of the composite deep trench isolation structure 110 has a bottommost surface that is below a topmost surface of the image sensing element 106.

Figure 3B:
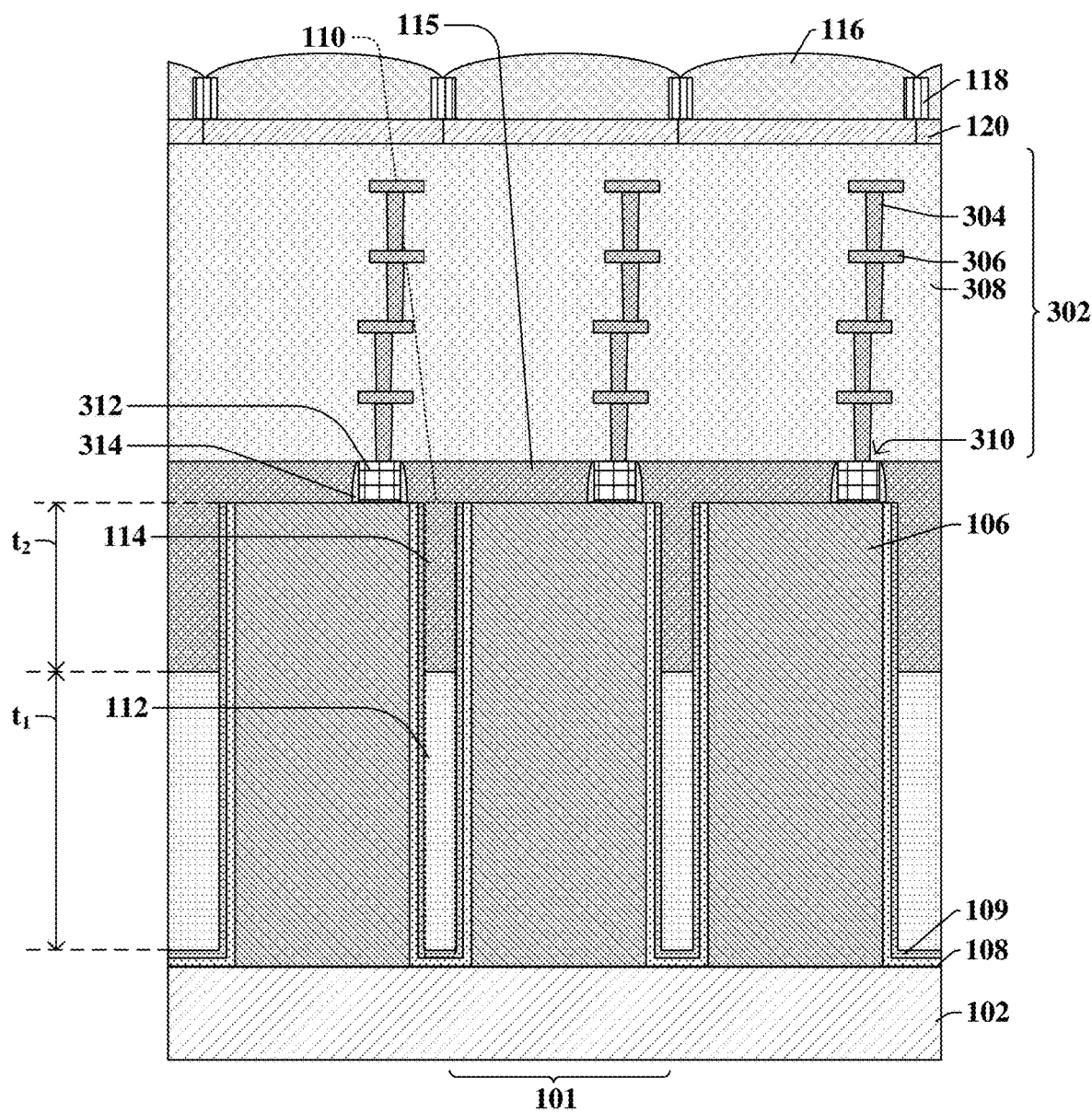
FIG. 3B illustrates a cross-sectional view of some embodiments of a frontside illumination (FSI) image sensor comprising multiple pixel regions arranged over a substrate, wherein the interconnect structure is arranged over image sensing elements.

FIG. 3B illustrates a cross-sectional view 300B of some embodiments of a frontside illumination (FSI) image sensor comprising a composite deep trench isolation structure.

In some embodiments, the interconnect structure 302 is arranged between the image sensing elements 106 and the micro-lenses 116. In some embodiments, the transistor gate structures 310 may be arranged over the image sensing elements 106 and extending through the upper isolation layer 115 to contact the image sensing elements 106. In some such embodiments, incident light must travel through the interconnect dielectric structure 308 of the interconnect structure 302 before entering the image sensing elements 106. Light traveling through the interconnect structure 302 may scatter and/or reflect off of the interconnect vias 304 and interconnect wires 306 and back out of the micro-lens 116 before reaching the image sensing element 106. Thus, in some embodiments, the BSI image sensor of FIG. 3A has a higher quantum efficiency than the FSI image sensor of FIG. 3B. Nevertheless, in some embodiments, once incident light does reach the image sensing element 106 in the FSI image sensor of FIG. 3B, the composite deep trench isolation structure 110 aids in keeping light within the image sensing element 106 and prevents cross-talk between pixel regions 101 to increase the quantum efficiency of the FSI image sensor.

Figure 4:
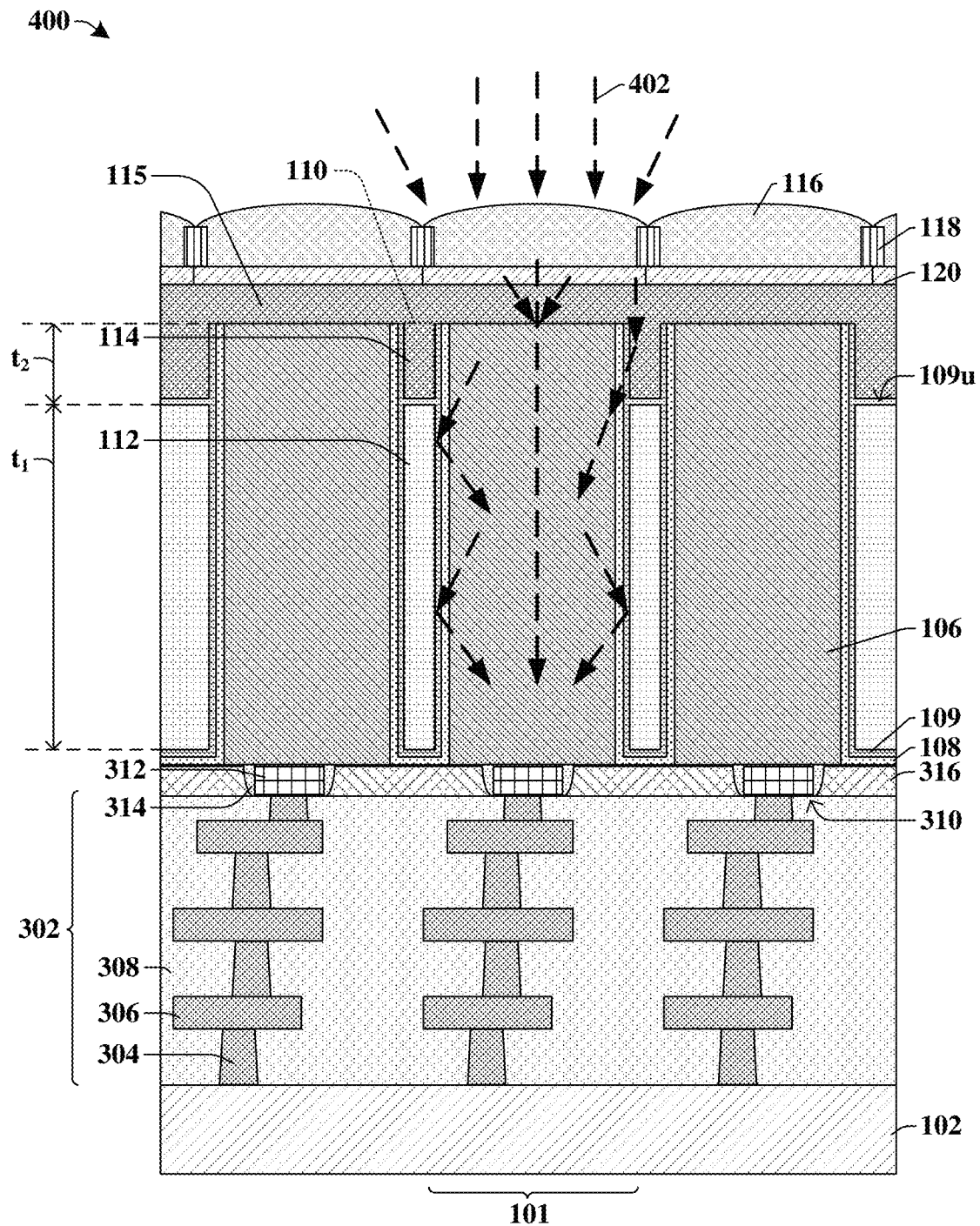
FIG. 4 illustrates a cross-sectional view of some embodiments of a BSI image sensor comprising composite deep trench isolation structures and exemplary light paths entering and traveling through a pixel region.

FIG. 4 illustrates cross-sectional view 400 of some embodiments of a BSI image sensor comprising a composite deep trench isolation structure and showing some exemplary light paths traveling through an image sensing element of a pixel region.

In some embodiments, the barrier layer 109 comprises an upper portion 109$u$ that is arranged directly between the upper and lower portions 114, 112 of the composite deep trench isolation structure 110. In such embodiments, the lower portion 112 of the composite deep trench isolation structure 110 is fully surrounded by the barrier layer 109 such that diffusion of the metal material of the lower portion 112 into the image sensing elements 106 and/or the upper portion 114 of the composite deep trench isolation structure is mitigated.

In some embodiments, the exemplary light paths 402 of FIG. 4 illustrate how incident light may enter a pixel region 101 through the micro-lens 116, which helps focus incident light towards the image sensing element 106. In some embodiments, the incident light may get filtered through the color filters 120 based on wavelengths, in some embodiments, before entering the image sensing element 106 such that the pixel region 101 collects data for a particular color. In some embodiments, because the upper isolation layer 115 comprises the first material that has a low reflectivity, the light travels through the upper isolation layer 115 as shown with the exemplary light paths 402, and little light is reflected off of the upper isolation layer 115 and out of the pixel region 101. Similarly, in some embodiments, light that is directed at the upper portion 114 of the composite deep trench isolation structure 110 travels through the upper portion 114, and little light is reflected off of the upper portion 114 and out of the pixel region 101. Further, light may be refracted in the upper portion 114 of the composite deep trench isolation structure 110 and directed towards the image sensing element 106. Thus, in some embodiments, the micro-lens 116, the upper isolation layer 115, and the upper portion 114 of the composite deep trench isolation structure 110 aid in directing incident light into the image sensing elements 106 to reduce incident light from escaping the pixel region 101.

Further, as the light continues to travel towards the interconnect structure 302, the exemplary light paths 402 show how the light reflects off of the lower portion 112 of the composite deep trench isolation structure 110 because the lower portion 112 comprises the second material with a high reflectivity. Thus, the lower portion1 112 of the composite deep trench isolation structure 110 keeps the light within the image sensing element 106 and prevents cross-talk of light between the pixel regions 101. Reducing the cross-talk and increasing the amount of light that travels through the pixel region 101 increases the ratio between the number of photons to the electrical signal that is generated from the light (i.e., photons), and thus, the quantum efficiency is increased.

Figure 5:
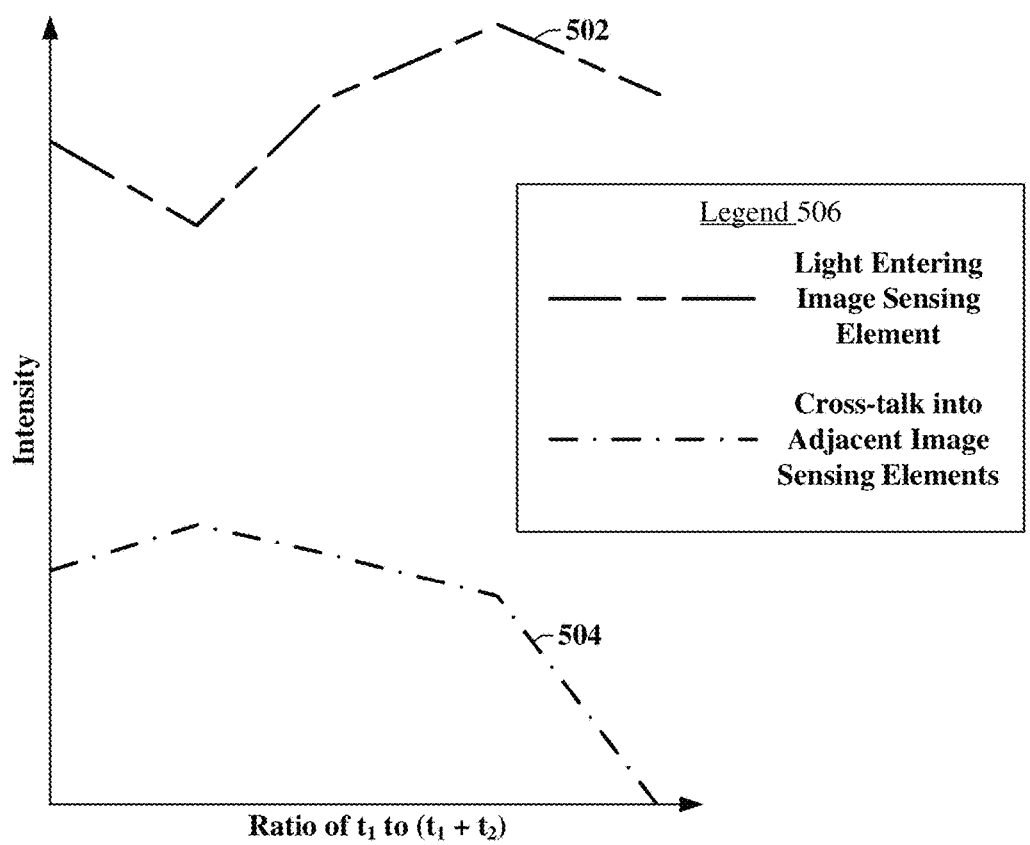
FIG. 5 illustrates a plot of some embodiments that shows how thickness of an upper and lower portion of the composite deep trench isolation structure effect the light intensity entering into a pixel region and cross-talk of light into adjacent pixel regions in a BSI image sensor.

FIG. 5 illustrates a plot 500 of some embodiments that shows how the ratio of the first thickness $t_1$ to the sum of the first and second thicknesses $t_1$, $t_2$ of the composite deep trench isolation structure affects the light intensity entering into a pixel region and cross-talk of light into adjacent pixel regions in a BSI image sensor.

The plot 500 includes light intensity versus the ratio of $t_1$, which is the thickness of the lower portion (112 of FIG. 4) of the composite deep trench isolation structure (110 of FIG. 4), to the sum of $t_1$ and $t_2$, wherein $t_2$ is the thickness of the upper portion (114 of FIG. 4) of the composite deep trench isolation structure (110 of FIG. 4). Thus, as the ratio of $t_1$ to the sum of $t_1$ and $t_2$ increases, the first thickness $t_1$ of the lower portion (112 of FIG. 4) of composite deep trench isolation structure (110 of FIG. 4) increases. It will be assumed that the sum of $t_1$ and $t_2$ is constant in the plot 500. Further, in some embodiments, the intensity is a percent representing the light received in a certain element(s) to incident light on the image sensor.

In some embodiments, as shown in the legend, the amount of light that enters a desired image sensing element (106 of FIG. 4) is illustrated by a first line 502, and the amount of light that enters into adjacent image sensing elements (106 of FIG. 4) through cross-talk is illustrated by a second line 504. To optimize the quantum efficiency of the image sensor, an optimal ratio of $t_1$ to the sum of $t_1$ and $t_2$ would have a high light intensity of the first line 502 and a low light intensity of the second line 504. In some embodiments, the optimal ratio of $t_1$ to the sum of $t_1$ and $t_2$ is in a range of between about 25 percent and about 100 percent. In some other embodiments, the optimal ratio of $t_1$ to the sum of $t_1$ and $t_2$ is in a range of between about 50 percent and about 100 percent. In some embodiments, the first line 502 increases and then decreases at a certain point because incident light reflects off of the surfaces of the lower portion (112 of FIG. 4) of the composite deep trench isolation structure (110 of FIG. 4) and out of the image sensing element (106 of FIG. 114). Thus, in some embodiments, the ratio of $t_1$ to the sum of $t_1$ and $t_2$ is less than 100 percent to increase the intensity of light entering the desired image sensing element (106 of FIG. 4). In other words, the second thickness ($t_2$ of FIG. 4) of the upper portion (114 of FIG. 14) of the composite deep trench isolation structure (110 of FIG. 4) is greater than zero.

It will be appreciated that the relationship in the plot 500 between the ratio and light intensity will vary amongst image sensors depending on the materials and dimensions of different elements in the image sensor, as well as the wavelength and angle of incident light on the image sensor.

FIGS. 6-15 illustrate cross-sectional views 600-1500 of some embodiments of a method of forming an integrated chip comprising a composite deep trench isolation structure between image sensing elements to increase the quantum efficiency of the overall CMOS image sensor. It will be appreciated that the steps illustrated in FIGS. 6-15 are illustrated as a BSI image sensor but may be modified for a composite deep trench isolation structure in a FSI image sensor, as illustrated in FIG. 3B. Further, although FIGS. 6-15 are described in relation to a method, it will be appreciated that the structures disclosed in FIGS. 6-15 are not limited to such a method, but instead may stand alone as structures independent of the method.

Figure 6:
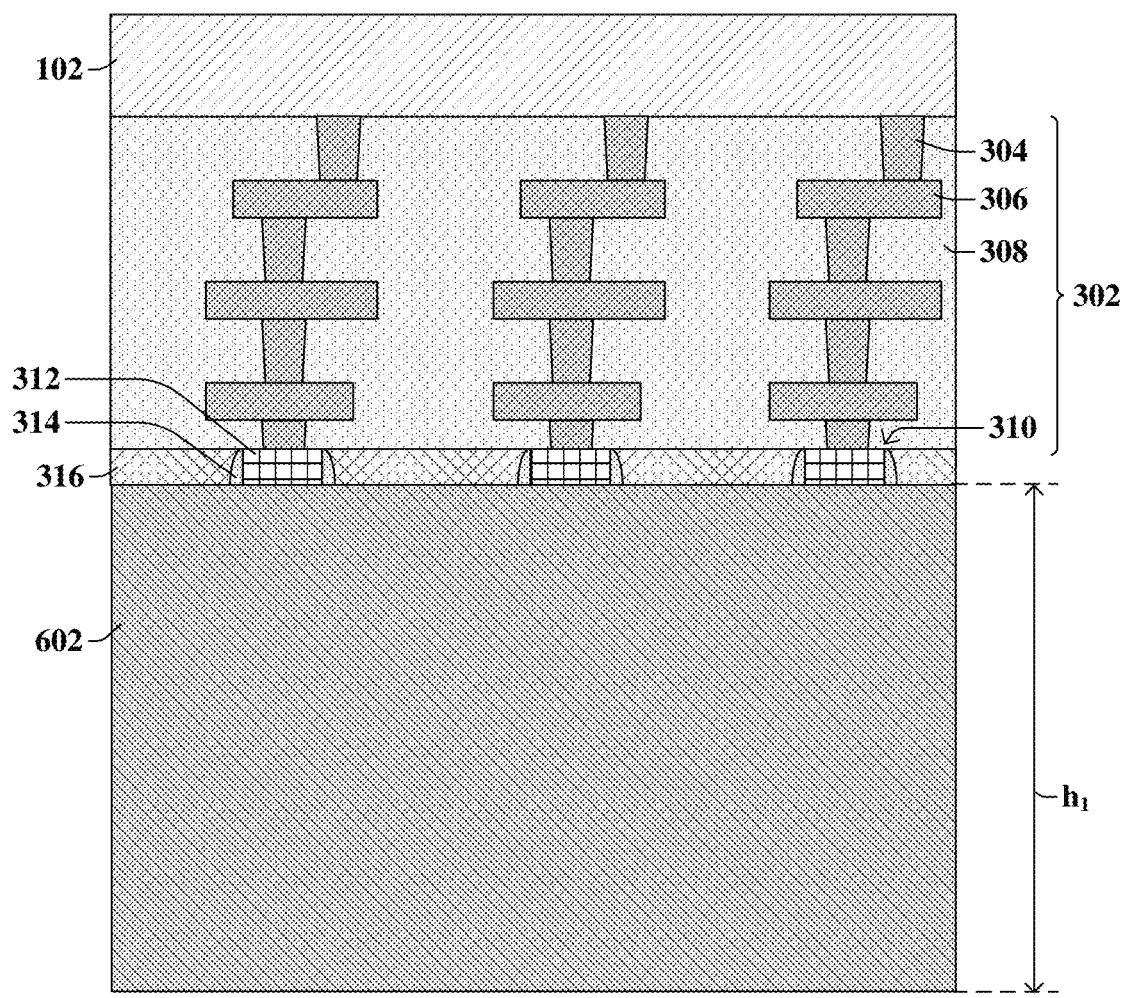
FIGS. 6-15 illustrate some embodiments of a method of forming a BSI image sensor with composite deep trench isolation structures arranged between pixel regions, wherein the composite deep trench isolation structures comprise a dielectric portion arranged over a metal portion.

As shown in cross-sectional view 600 of FIG. 6, in some embodiments, an interconnect structure 302 is formed over a bulk substrate 602. In some embodiments, the bulk substrate 602 comprises a semiconductor material such as, for example, silicon or germanium. In some embodiments, the bulk substrate 602 may comprise, for example a silicon-on-insulator substrate and thus, may comprise multiple layers including a base substrate, an insulator layer, and an active layer. In some embodiments, the bulk substrate 602 is doped and/or comprises doped regions by way of implantation processes. In some embodiments, the bulk substrate 602 has a first height hi in a range of between, for example, approximately 1 micrometer and approximately 2 micrometers.

In some embodiments, transistor gate structures 310 may be formed over a first side of the bulk substrate 602. In some embodiments, the transistor gate structures 310 comprise gate electrodes 312 and gate spacer structures 314 surrounding the gate electrodes 312. In some embodiments, the transistor gate structures 310 may correspond to a transfer transistor, a source-follower transistor, a row select transistor, and/or a reset transistor. In some embodiments, the transistor gate structures 310 are formed by depositing a gate electrode film (e.g., a conductive metal, a semiconductor, etc.) over the bulk substrate 602. Then, the gate electrode film is patterned by photolithography and removal processes to form the multiple gate electrodes 312. In some embodiments, the gate spacer structures 314 are formed by depositing a spacer layer (e.g., a nitride, an oxide, etc.) onto the bulk substrate 602 and then selectively etching the spacer layer. In some embodiments, a lower isolation structure 316 is then formed over the transistor gate structures 310 by way of a deposition process (e.g., physical vapor deposition (PVD), chemical vapor deposition (CVD), atomic layer deposition (ALD), etc.) and removal processes (e.g., etching, planarization, etc.).

In some embodiments, the interconnect structure 302 may then be formed over the transistor gate structures 310. In some embodiments, the interconnect structure 302 comprises an interconnect dielectric structure 308 comprising multiple dielectric layers comprising, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, a network of interconnect vias 304 and interconnect wires 306 are formed within the interconnect dielectric structure 308 through various steps of deposition processes (e.g., PVD, CVD, ALD, sputtering, etc.), removal processes (e.g., wet etching, dry etching, chemical mechanical planarization (CMP), etc.), and/or patterning processes (e.g., photolithography/etching). In some embodiments, the interconnect vias 304 and interconnect wires 306 comprise, for example, tantalum, titanium, aluminum, copper, tungsten, or some other suitable conductive material.

In some embodiments, the interconnect structure 302 may then be bonded to a substrate 102. In some embodiments, the substrate 102 comprises a semiconductor material, such as silicon. In some embodiments, the substrate 102 may comprise various semiconductor devices, interconnect structures, and/or other processing circuitry coupled to the interconnect structure 302.

Figure 7:
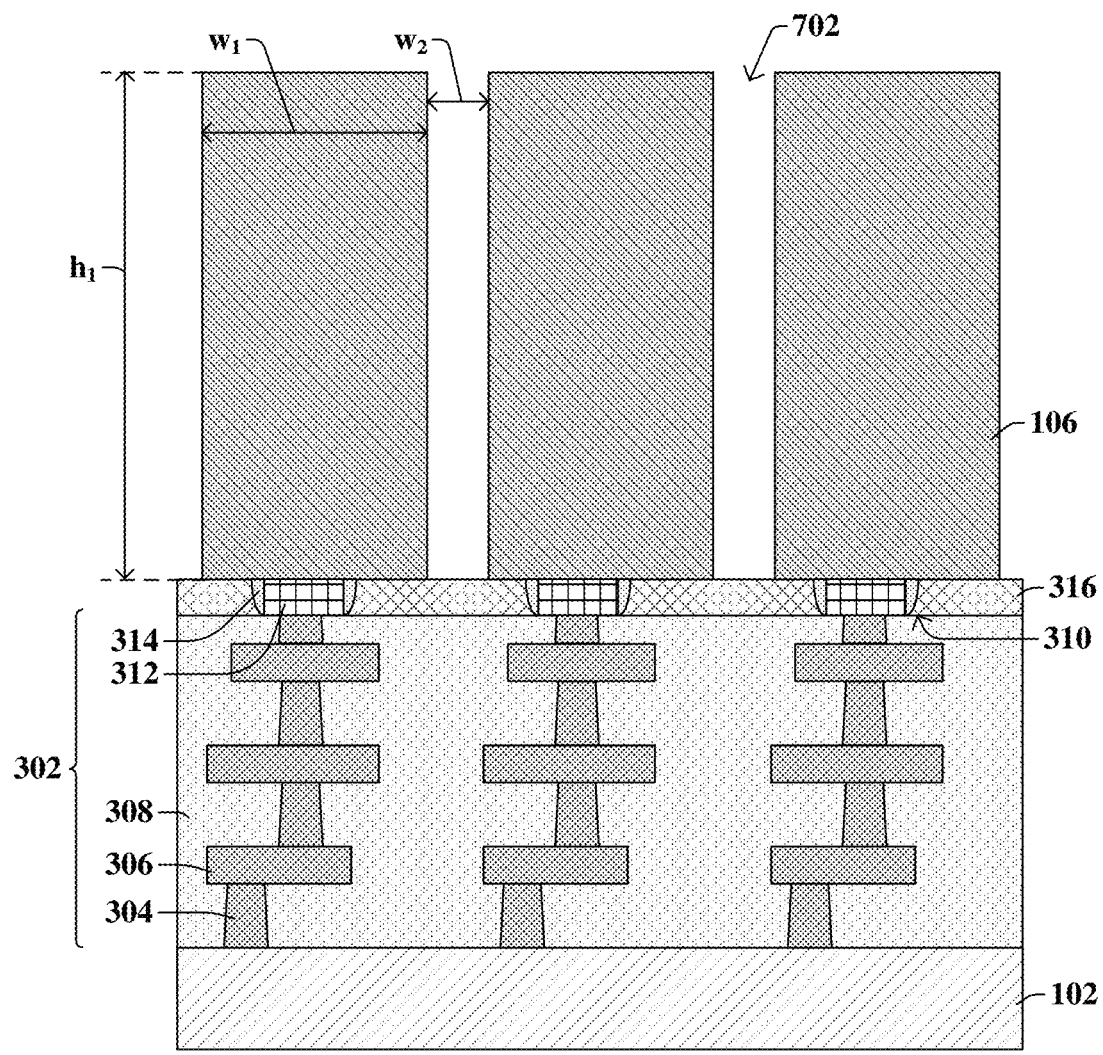

As shown in cross-sectional view 700 of FIG. 7, in some embodiments, the substrate 102 is flipped over such that a second side of the bulk substrate (602 of FIG. 6) may be patterned. In some embodiments, trenches 702 are formed in the bulk substrate (602 of FIG. 6) to formed image sensing elements 106 over the substrate 102. In some embodiments, the trenches 702 may be formed according to openings in a masking structure (not shown) arranged over the bulk substrate (602 of FIG. 6). In some embodiments, the masking structures is formed through various steps of deposition processes (e.g., PVD, CVD, ALD, sputtering, etc.), removal processes (e.g., wet etching, dry etching, CMP, etc.), and/or patterning processes (e.g., photolithography/etching). In some embodiments, a wet or dry etching process may be used to form the trenches 702 according to the masking structure. The trenches 702 extend completely through the bulk substrate (602 of FIG. 6) such that the image sensing elements 106 are completely spaced apart from one another.

In some embodiments, each image sensing element 106 is arranged over one of the transistor gate structures 310. In some embodiments, the image sensing elements 106 are doped to form photodiodes. For example, the photodiodes may be formed by selectively performing a first implantation process (e.g., according to a masking layer) to form a first region having a first doping type (e.g., n-type), and subsequently performing a second implantation process to form a second region abutting the first region and having a second doping type (e.g., p-type) different than the first doping type. In some embodiments a floating diffusion well (not shown) may also be formed using one of the first or second implantation processes. In some other embodiments, the doping/implantation processes to form the photodiodes of the image sensing elements 106 may be performed prior to the formation of the trenches 702 as discussed in FIG. 6, for example. Nevertheless, in some embodiments, the bulk substrate (602 of FIG. 6) comprises an image sensing material for the image sensing elements 106.

In some embodiments, the image sensing elements 106 have a first width $w_1$, and the trenches 702, which separate the image sensing elements 106 from one another have a second width $w_2$. In some embodiments, the first width $w_1$ is in a range of between, for example, approximately 0.1 micrometers and approximately 0.2 micrometers. In some embodiments, the second width $w_2$ is in a range of between, for example, approximately 0.5 micrometers and approximately 1 micrometer.

Figure 8:
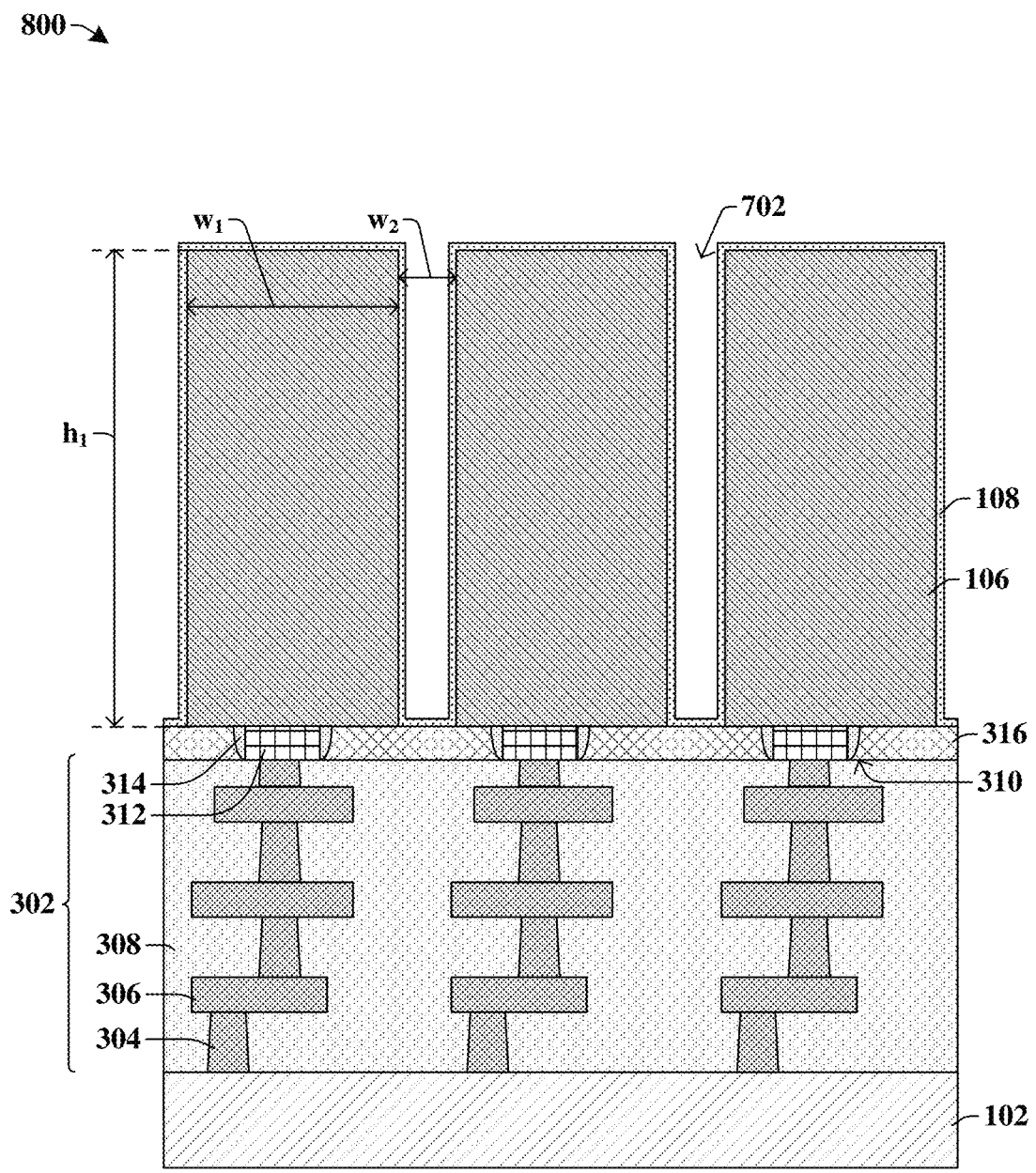

As shown in cross-sectional view 800 of FIG. 8, in some embodiments, a passivation layer 108 is formed over the image sensing elements 106 and the lower isolation structure 316. In some embodiments, the passivation layer 108 comprises, for example, tantalum nitride, titanium nitride, or the like. In some embodiments, the passivation layer 108 is used to protect the image sensing elements 106 from damage during future processing steps. In some embodiments, the passivation layer 108 is formed by a deposition process (e.g., PVD, CVD, ALD, sputtering, etc.). The passivation layer 108 does not completely fill the trenches 702. Thus, the passivation layer 108 has a thickness that is less than one half of the second width $w_2$ of the trenches 702.

Figure 9:
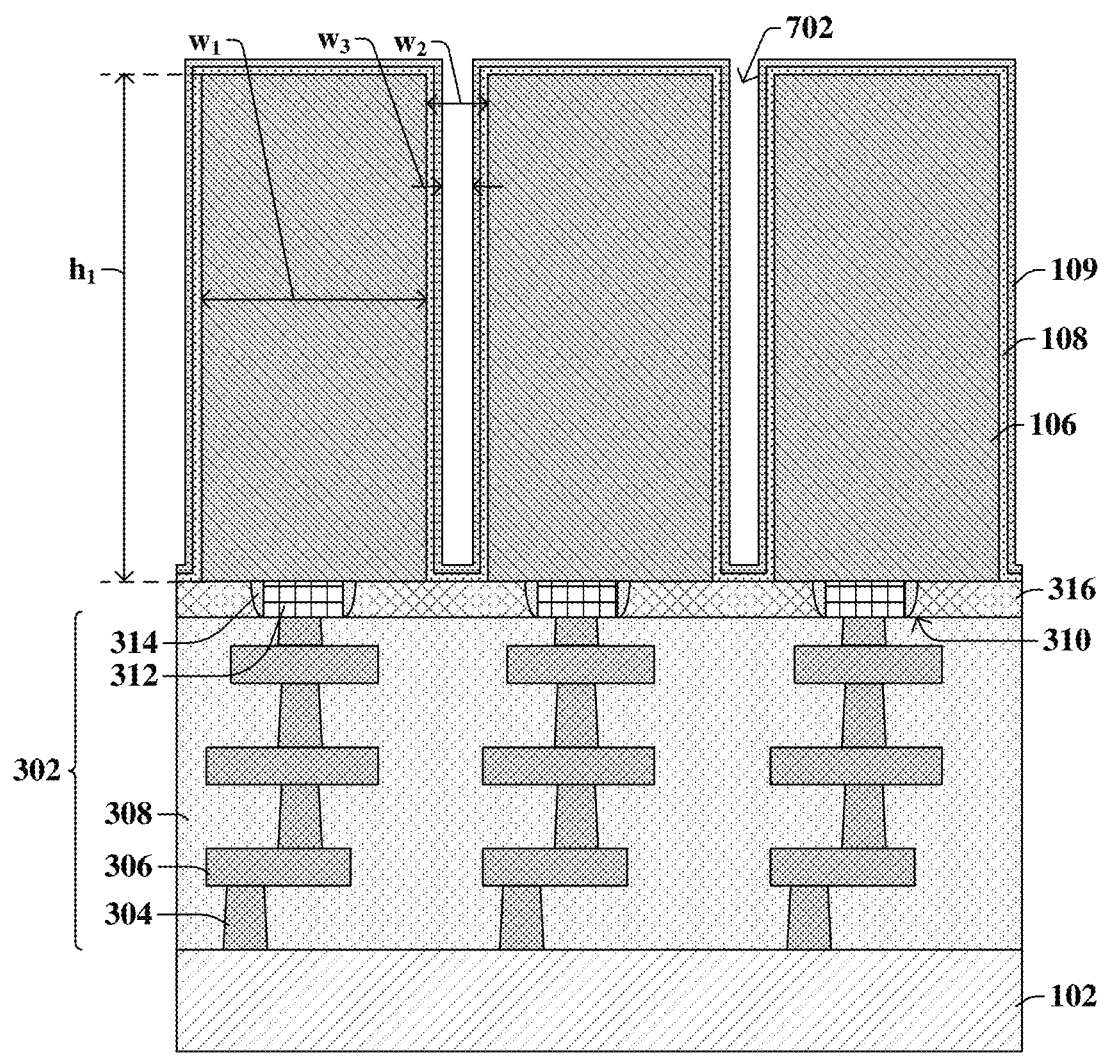

As shown in cross-sectional view 900 of FIG. 9, in some embodiments, a barrier layer 109 is formed over the passivation layer 108. In some embodiments, the barrier layer 109 comprises, for example, titanium nitride, tantalum nitride, or some other diffusion barrier material. In some embodiments, the barrier layer 109 is used to prevent metal diffusion from metal materials to be formed over the substrate 102 into the image sensing elements 106. In some embodiments, the barrier layer 109 is formed by a deposition process (e.g., PVD, CVD, ALD, sputtering, etc.). The barrier layer 109 and the passivation layer 108 do not completely fill the trenches 702. Thus, a sum of the thicknesses of the passivation layer 108 and the barrier layer 109 are less than one half of the second width $w_2$ of the trenches 702. After the deposition of the passivation layer 108 and the barrier layer 109, the trenches 702 have a third width $w_3$ that is less than the second width $w_2$.

Figure 10:
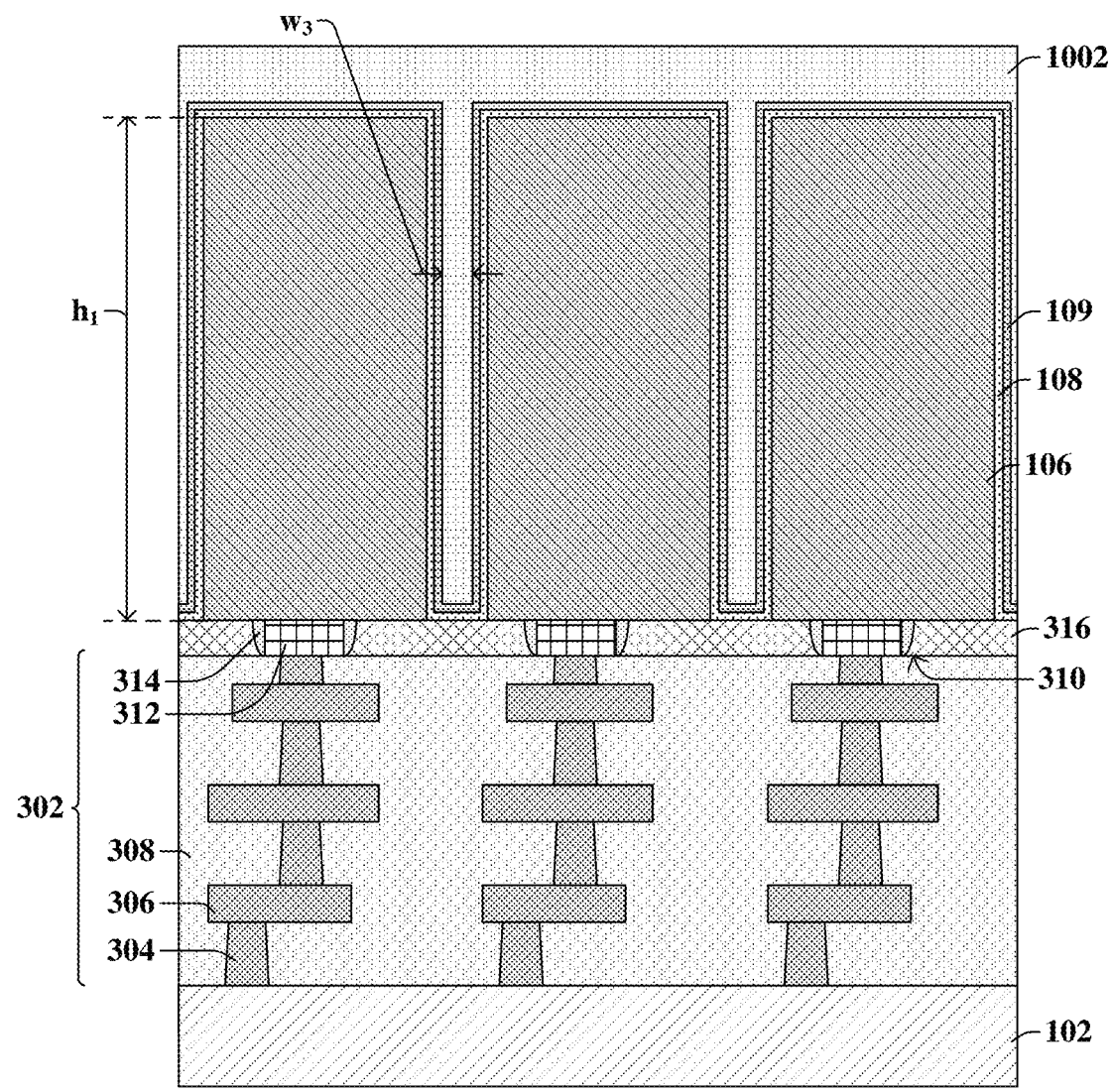

As shown in cross-sectional view 1000 of FIG. 10, a first material 1002 is formed over the image sensing elements 106 to completely fill the trenches (702 of FIG. 9). In some embodiments, the first material 1002 is formed by way of a deposition process (e.g., PVD, CVD, ALD, sputtering, etc.). In some embodiments, the first material 1002 comprises a material that has a high reflectivity when incident light of varying wavelengths is applied to the first material 1002. For example, in some embodiments, the first material 1002 may comprise copper, aluminum, aluminum copper, tantalum, titanium, tungsten, titanium nitride, or some other suitable reflective material. In some embodiments, portions of the first material 1002 arranged directly between the image sensing elements 106 have a width equal to the third width $w_3$.

Figure 11:
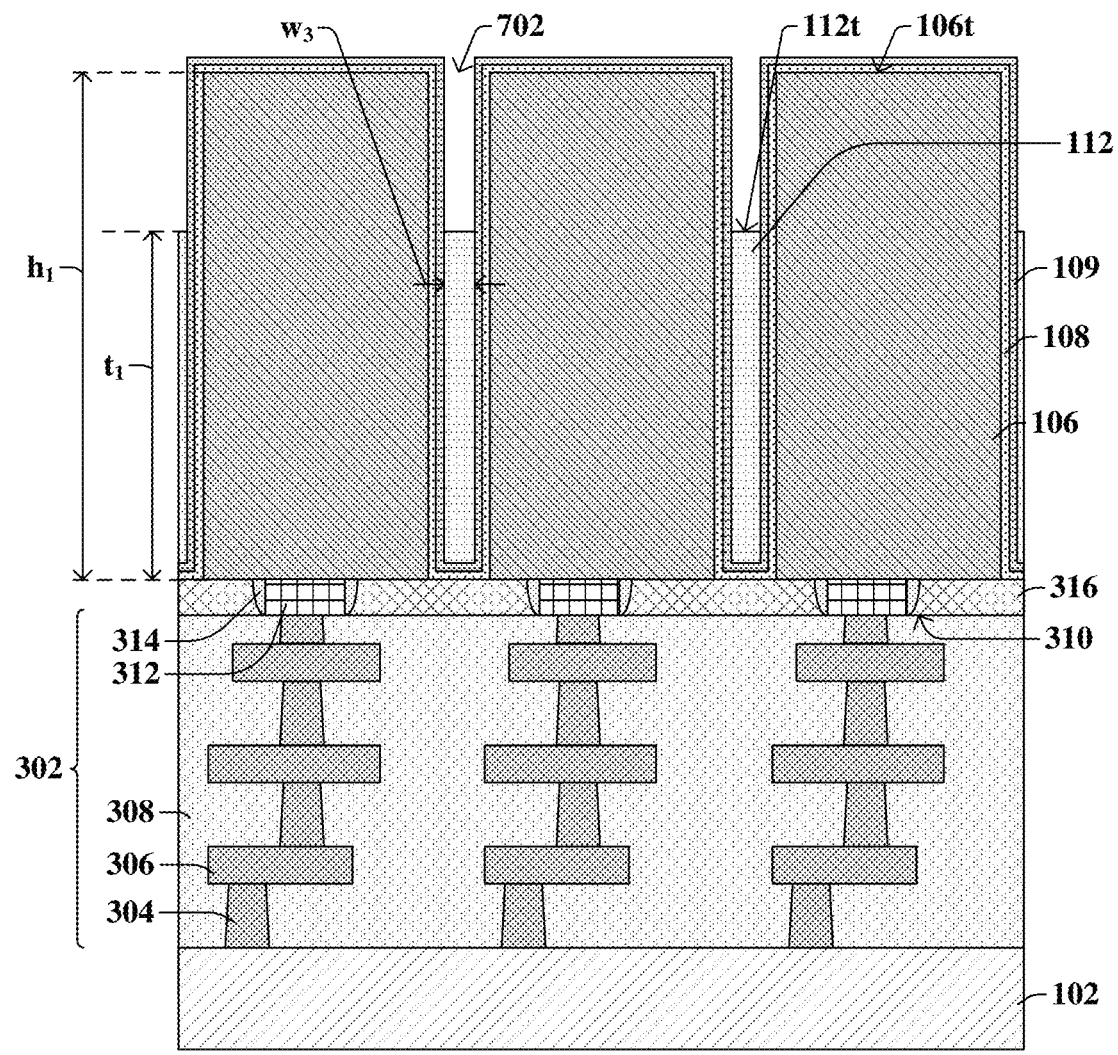

As shown in cross-sectional view 1100 of FIG. 11, a removal process is performed to remove upper portions of the first material (1002 of FIG. 10) to form a lower portion 112 of a composite deep trench isolation structure 110 arranged between the image sensing elements 106. In some embodiments, the removal process of FIG. 11 comprises, for example, a wet etching process, a dry etching process, and/or a metal de-plating process. In some embodiments, the removal process of FIG. 11 is controlled by time and is controlled to remove enough of the first material (1002 of FIG. 10) such that the lower portion 112 has a desired first thickness $t_1$. In some embodiments, the first thickness $t_1$ is between about 50 percent to about 100 percent of the first height hi. In some embodiments, the first thickness $t_1$ is less than the first height hi such that a topmost surface 112t of the lower portion 112 is below a topmost surface 106t of the image sensing elements 106. In some embodiments, segments of the lower portion 112 of the composite deep trench isolation structure arranged between the image sensing elements 106 have a width equal to the third width $w_3$. After the removal process of FIG. 11, upper portions of the trenches 702 are opened back up above the lower portion 112 of the composite deep trench isolation structure.

Figure 12A:
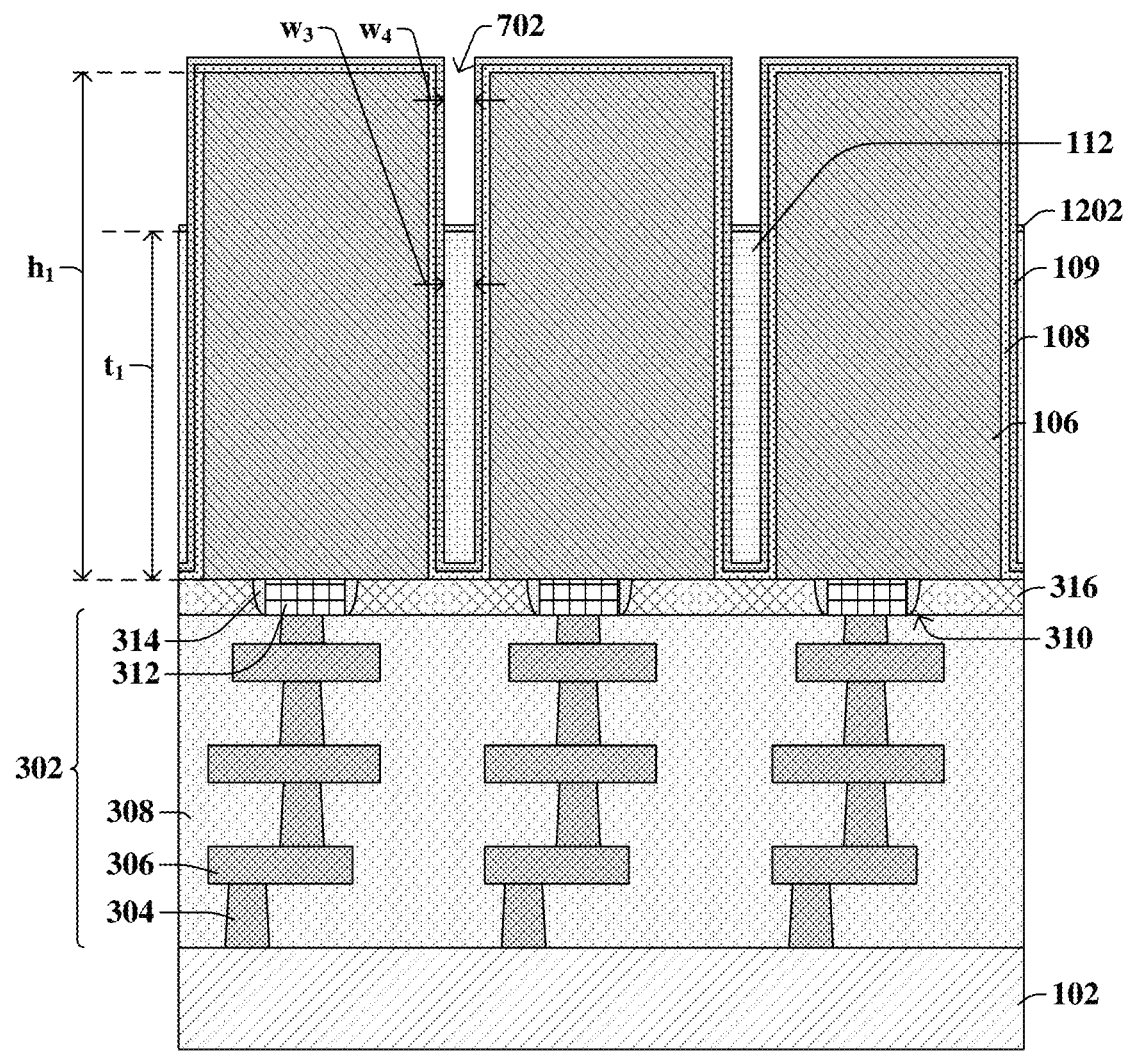

As shown in cross-sectional view 1200A of FIG. 12A, in some embodiments after forming the lower portion 112 of the composite deep trench isolation structure, the method proceeds with forming an additional barrier layer 1202 over the lower portion 112 of the composite deep trench isolation structure. In some embodiments, the additional barrier layer 1202 comprises a same material as the barrier layer 109. In some embodiments, the additional barrier layer 1202 is formed by a deposition process (e.g., PVD, CVD, ALD, sputtering, etc.). In some embodiments, the additional barrier layer 1202 is selectively formed over the lower portion 112 of the composite deep trench isolation structure and thus, is not formed directly the barrier layer 109. Thus, in some embodiments, the trenches 702 arranged over the lower portion 112 of the composite deep trench isolation structure have a fourth width $w_4$ about equal to the third width $w_3$.

In some embodiments, because of the barrier layer 109 and the additional barrier layer 1202, all surfaces of the lower portion 112 of the composite deep trench isolation structure are covered by the metal diffusion barrier material such that the metal material of the lower portion 112 does not diffuse into the image sensing elements 106.

Figure 12B:
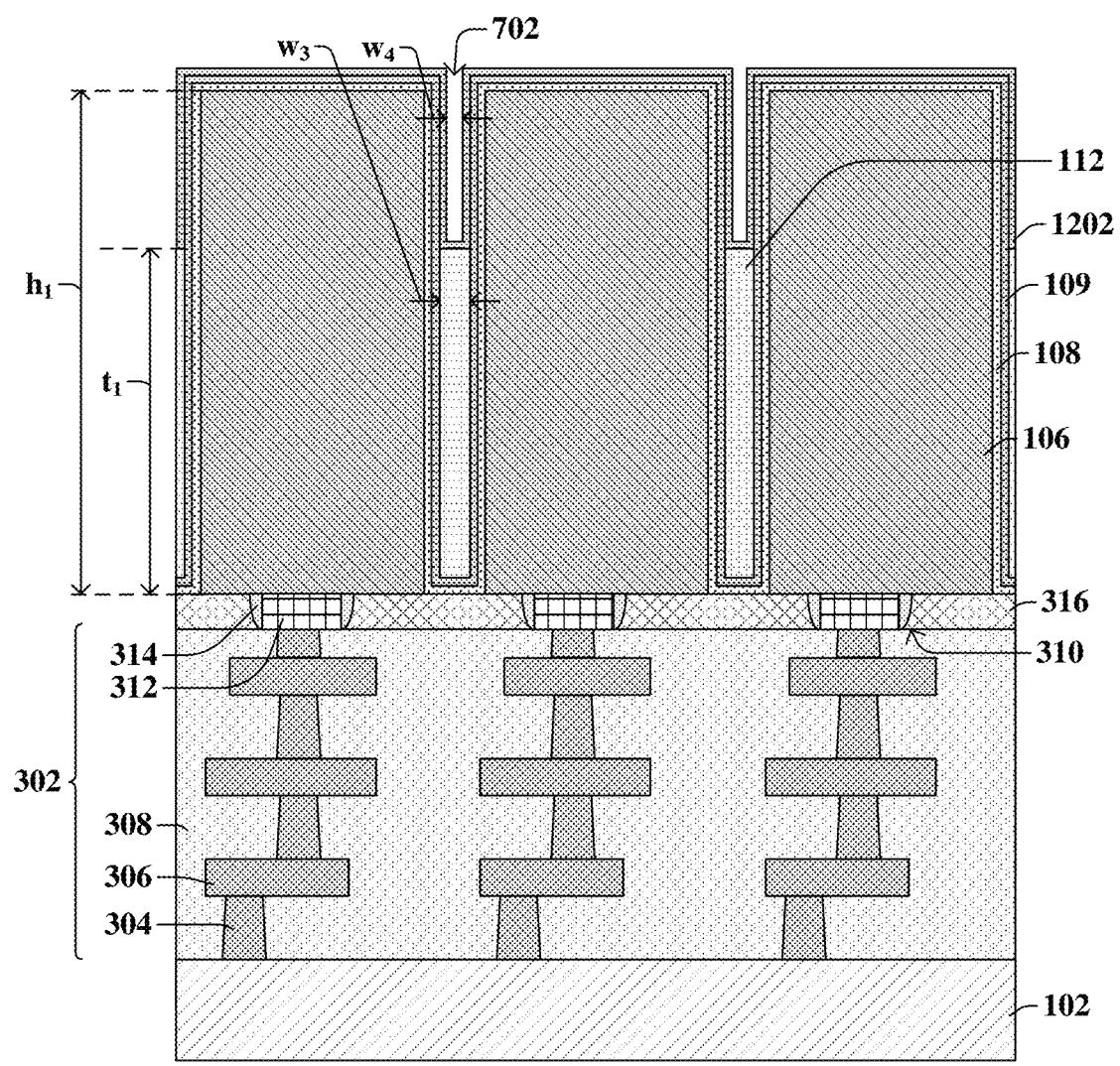

FIG. 12B illustrates a cross-sectional view 1200B of some alternative embodiments of forming the additional barrier layer 1202 over the lower portion 112 of the composite deep trench isolation structure.

As shown in cross-sectional view 1200B of FIG. 12B, in some embodiments, the additional barrier layer 1202 is not selectively formed over the lower portion 112 of the composite deep trench isolation structure. Instead, in some embodiments, the additional barrier layer 1202 is formed over the barrier layer 109 and the lower portion 112 of the composite deep trench isolation structure. In some such embodiments, the trenches 702 arranged over the lower portion 112 have a fourth width $w_4$ that is less than the third width $w_3$. Thus, in some embodiments, an upper portion of the composite deep trench isolation structure to be formed within the trenches 702 of FIG. 12B will be narrower than the lower portion 112 of the composite deep trench isolation structure.

In some other embodiments, the formation of the additional barrier layer 1202 illustrated in FIGS. 12A and 12B is omitted. By omitting the additional barrier layer 1202, time and materials may be saved during manufacturing. However, by including the additional barrier layer 1202, metal diffusion from the lower portion 112 is mitigated. Thus, in some embodiments, the method may proceed from FIG. 11 to FIG. 12A and then to FIG. 13; from FIG. 11 to FIG. 12B and then to FIG. 13; or from FIG. 11 to FIG. 13, thereby omitting the formation of the additional barrier layer 1202.

Figure 13:
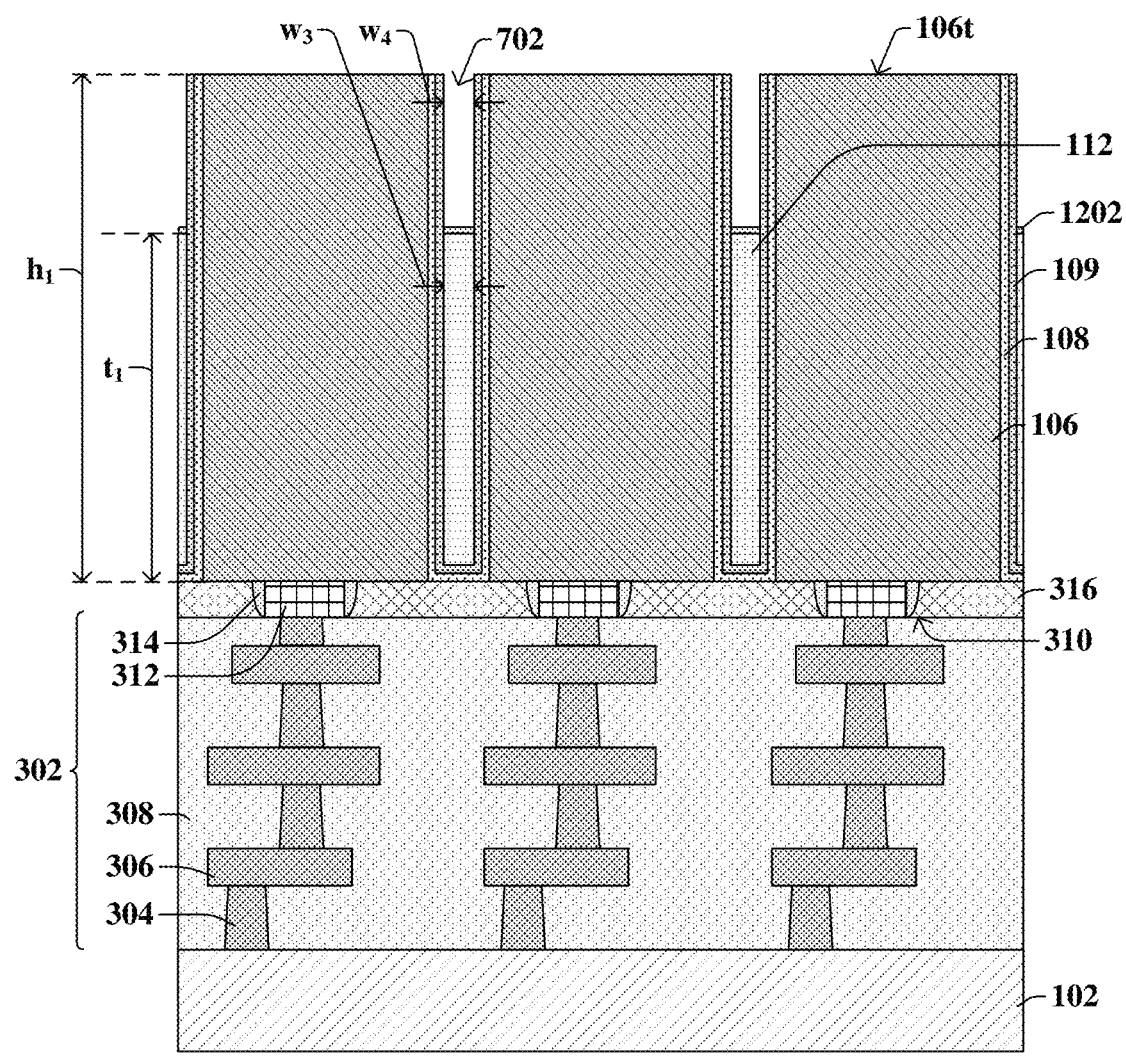

Cross-sectional view 1300 of FIG. 13 proceeds from the steps illustrated in cross-sectional view 1200A of FIG. 12A. As shown in the cross-sectional view 1300 of FIG. 13, in some embodiments, a removal process is performed to remove the barrier layer 109 and the passivation layer 108 from the topmost surfaces 106t of the image sensing elements 106. In some embodiments, the removal process of FIG. 13 comprises a planarization process (e.g., CMP) such that topmost surfaces of the passivation layer 108 and the barrier layer 109 are substantially coplanar with the topmost surfaces 106t of the image sensing elements 106.

Figure 14:
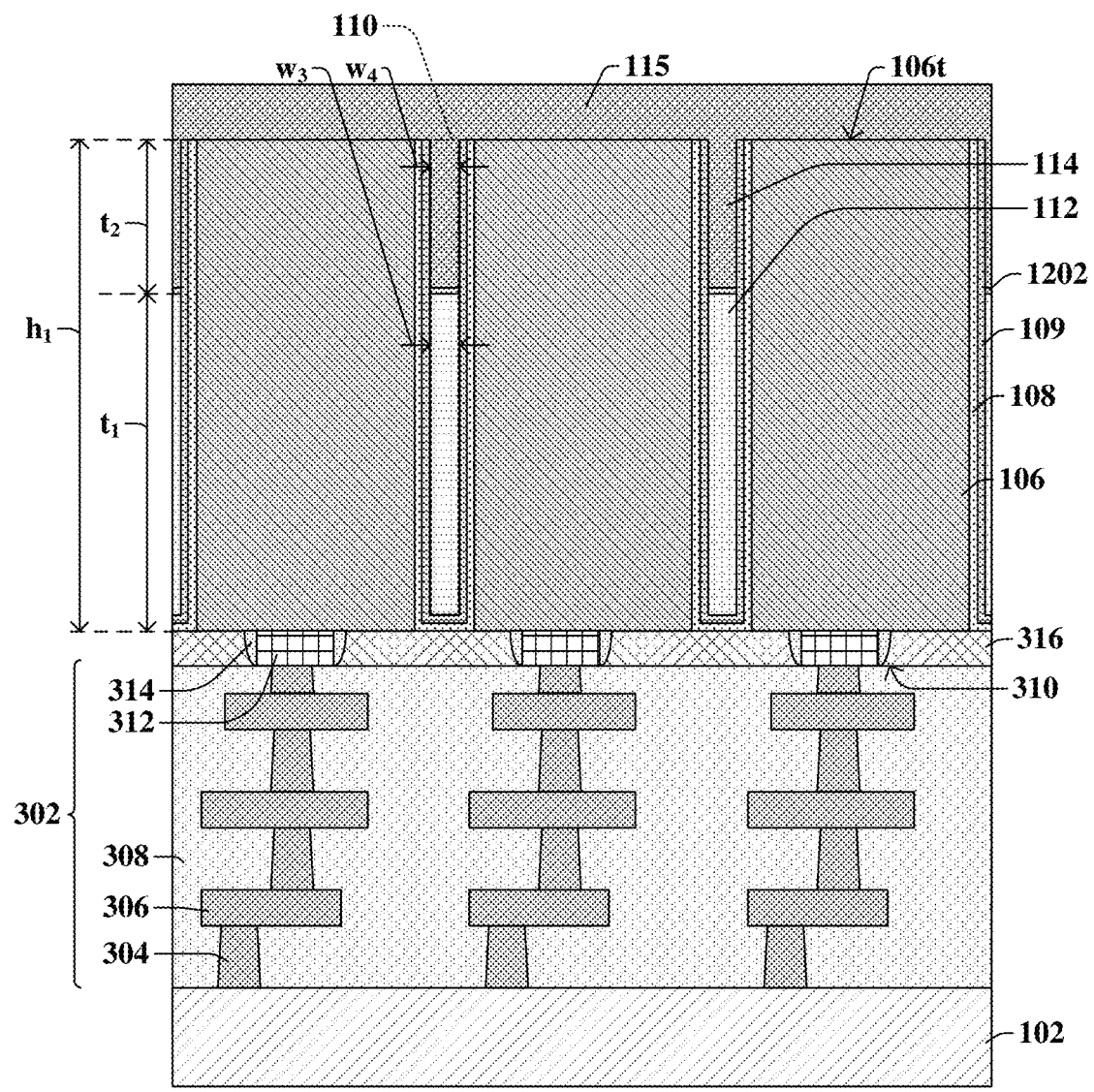

As shown in cross-sectional view 1400 of FIG. 14, in some embodiments, a second material is formed over lower portion 112 and the image sensing elements 106 to fill the remaining portions of the trenches (702 of FIG. 13) thereby forming an upper portion 114 of the composite deep trench isolation structure 110. In some embodiments, the second material is formed by way of a deposition process (e.g., PVD, CVD, ALD, etc.) followed by a planarization process (e.g., CMP). Portions of the second material arranged above the image sensing elements 106 form an upper isolation layer 115. In some embodiments, the upper isolation layer 115 has a thickness in a range of between, for example, approximately 0.1 micrometers and approximately 1 micrometer. In some embodiments, the second material comprises a dielectric material, such as, for example, a nitride (e.g., silicon nitride), an oxide (e.g., silicon dioxide), or the like. Further, in some embodiments, the second material of the upper portion 114 has a lower reflectivity than the first material of the lower portion 112 of the composite deep trench isolation structure 110.

In some embodiments, the upper portion 114 of the composite deep trench isolation structure 110 has the fourth width $w_4$ that is less than or equal to the third width $w_3$ of the lower portion 112 of the composite deep trench isolation structure 110. In some embodiments, the upper portion 114 has a second thickness $t_2$ measured between a bottommost surface of the upper portion 114 to the topmost surface 106t of the image sensing element 106. In some embodiments, a sum of the second thickness $t_2$ and the first thickness $t_1$ is about equal to the first height hi of the image sensing elements.

Figure 15:
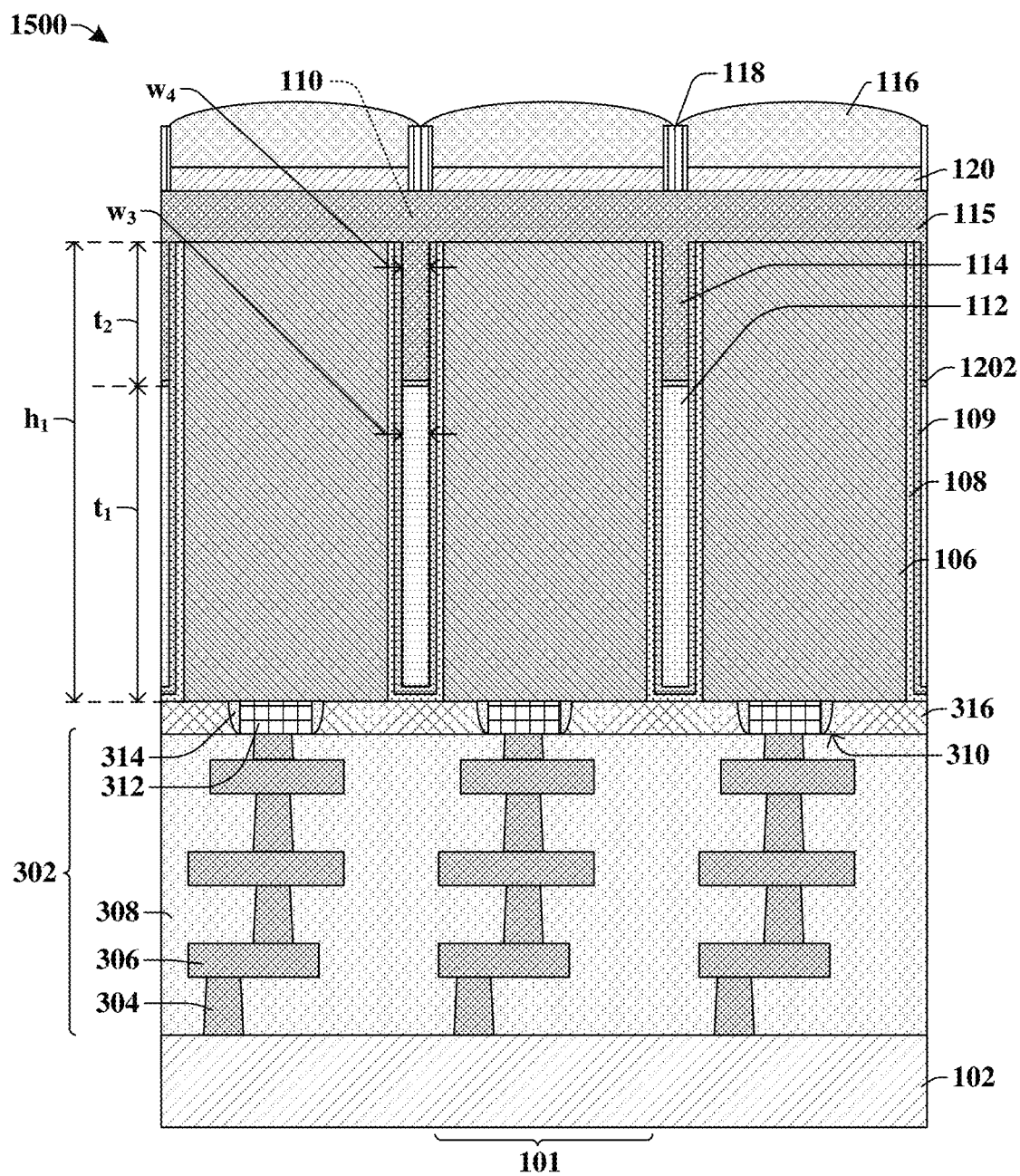

As shown in cross-sectional view 1500 of FIG. 15, color filters 120 are formed over the upper isolation layer 115. In some embodiments, the color filters 120 may be formed between and after the formation of micro-lens isolation structures 118. In some embodiments, the micro-lens isolation structures 118 and the color filters 120 are formed through various steps of deposition processes (e.g., PVD, CVD, ALD, sputtering, etc.), removal processes (e.g., wet etching, dry etching, CMP, etc.), and/or patterning processes (e.g., photolithography/etching). In some embodiments, the color filters 120 comprise a material that allows for the transmission of radiation (e.g., light) having a specific range of wavelength, while blocking light of wavelengths outside of the specific range.

In some embodiments, micro-lenses 116 are formed over the color filters 120. In some embodiments, the micro-lenses 116 are formed by depositing a micro-lens material over the color filters 120 by a spin-on or deposition process. Then, a micro-lens template may be used to pattern curved surfaces onto the micro-lens material by etching to form the micro-lenses 116. The micro-lenses 116 help focus incident light towards the image sensing element 106 of a pixel region 101. Each pixel region 101 may comprise a micro-lens 116, a color filter 120, an image sensing element 106, and processing circuitry (e.g., transistor gate structures 310, the interconnect structure 302, and the like).

The composite deep trench isolation structure 110 continuously surrounds the image sensing elements 106 of each pixel region 101. The second material of the upper portion 114 and the upper isolation layer 115 increase the percent of incident light that enters the image sensing element 106 of the pixel region 101 because the second material has a low reflectivity. In some embodiments, the lower portion 112 of the composite deep trench isolation structure 110 comprises the second material with a higher reflectivity than the first material to prevent light from traveling into other image sensing elements 106. Thus, by increasing the intensity of incident light received by the image sensing element 106 and by preventing cross-talk between image sensing elements 106, the composite deep trench isolation structure 110 increases the quantum efficiency of the pixel regions 101 of the CMOS image sensor.

Figure 16:
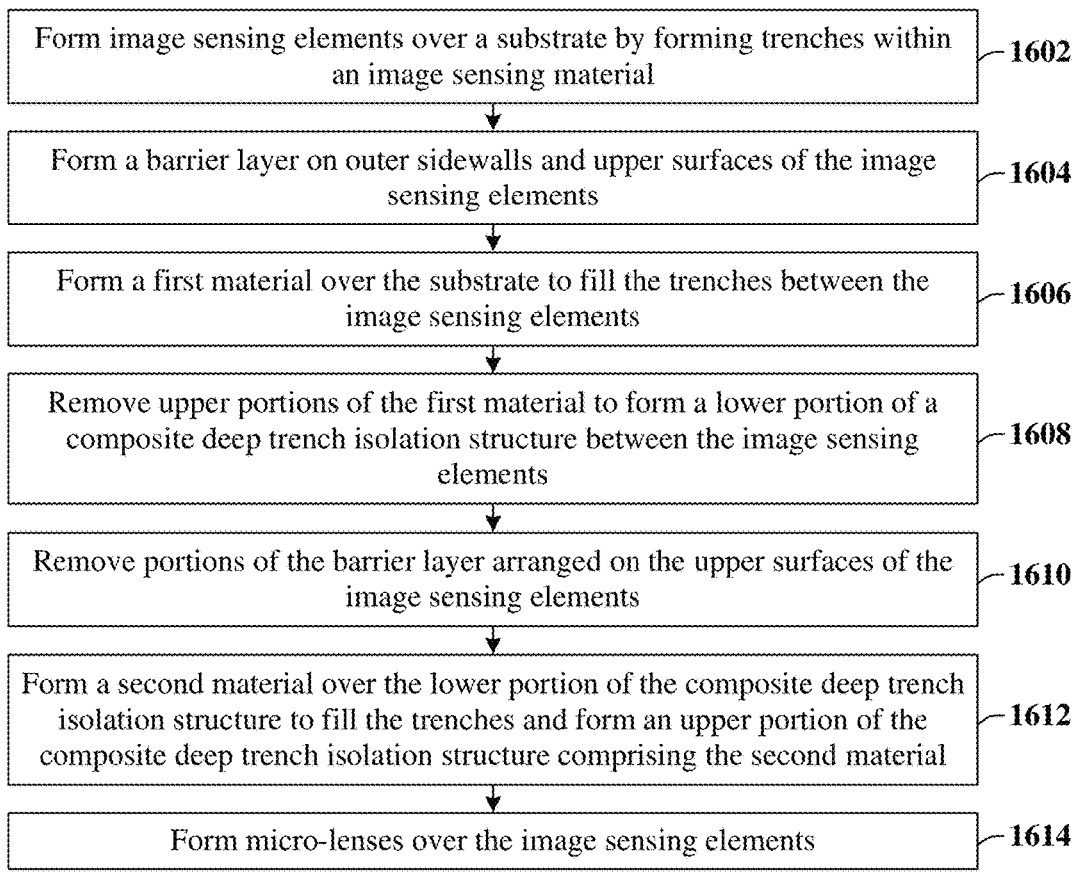
FIG. 16 illustrates a flow diagram of some embodiments of the method illustrated in FIGS. 6-15.

FIG. 16 illustrates a flow diagram of some embodiments of a method 1600 corresponding to FIGS. 6-15.

While method 1600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1602, image sensing elements are formed over a substrate by forming trenches within an image sensing material. FIG. 7 illustrates a cross-sectional view 700 of some embodiments corresponding to act 1602.

At act 1604, a barrier layer is formed on outer sidewalls and upper surfaces of the image sensing elements. FIG. 9 illustrates a cross-sectional view 900 of some embodiments corresponding to act 1604.

At act 1606, a first material is formed over the substrate to fill the trenches between the image sensing elements. FIG. 10 illustrates cross-sectional view 1000 of some embodiments corresponding to act 1606.

At act 1608, upper portions of the first material are removed to form a lower portion of a composite deep trench isolation structure between the image sensing elements. FIG. 11 illustrates cross-sectional view 1100 of some embodiments corresponding to act 1608.

At act 1610, portions of the barrier layer that are arranged on the upper surfaces of the image sensing elements are removed. FIG. 13 illustrates cross-sectional view 1300 of some embodiments corresponding to act 1610.

At act 1612, a second material is formed over the lower portion of the composite deep trench isolation structure to fill the trenches and form an upper portion of the composite deep trench isolation structure comprising the second material. FIG. 14 illustrates cross-sectional view 1400 of some embodiments corresponding to act 1612.

At act 1614, micro-lenses are formed over the image sensing elements. FIG. 15 illustrates cross-sectional view 1500 of some embodiments corresponding to act 1614.

Therefore, the present disclosure relates to a method of forming a composite deep trench isolation structure between pixel regions of a CMOS image sensor, wherein the composite deep trench isolation structure comprises a lower portion having a higher reflectivity than an upper portion to increase the quantum efficiency of the CMOS image sensor.

Accordingly, in some embodiments, the present disclosure relates to an integrated chip, comprising: a first image sensing element arranged over a substrate; a first micro-lens arranged over the first image sensing element; a second image sensing element arranged over a substrate; a second micro-lens arranged over the second image sensing element; and a composite deep trench isolation structure arranged between the first and second image sensing elements and comprising: a lower portion arranged over the substrate and comprising a first material, and an upper portion arranged over the lower portion and comprising a second material that has a higher reflectivity than the first material.

In other embodiments, the present disclosure relates to an integrated chip comprising: a plurality of image sensing elements arranged over a substrate; processing circuitry coupled to the plurality of image sensing elements; micro-lenses arranged over the plurality of image sensing elements; and a composite deep trench isolation structure arranged over the substrate, separating the plurality of image sensing elements from one another, and comprising: a lower portion comprising a first material having a first reflectivity, and an upper portion comprising a second material having a second reflectivity less than the first reflectivity, wherein the upper portion of the composite deep trench isolation structure has a bottommost surface arranged below topmost surfaces of the plurality of image sensing elements.

In yet other embodiments, the present disclosure relates to a method comprising: forming image sensing elements over a substrate by forming trenches within an image sensing material; forming a barrier layer on outer sidewalls and upper surfaces of the image sensing elements; forming a first material over the substrate to fill the trenches between the image sensing elements; removing upper portions of the first material to form a lower portion of a composite deep trench isolation structure between the image sensing elements; removing portions of the barrier layer arranged on the upper surfaces of the image sensing elements; forming a second material over the lower portion of the composite deep trench isolation structure to fill the trenches and form an upper portion of the composite deep trench isolation structure comprising the second material; and forming micro-lenses over the image sensing elements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming image sensing elements over a substrate by forming trenches within an image sensing material;
   forming a barrier layer on outer sidewalls and upper surfaces of the image sensing elements;
   forming a first material over the substrate to fill the trenches between the image sensing elements;
   removing upper portions of the first material to form a lower portion of a composite deep trench isolation structure between the image sensing elements;
   forming an additional barrier layer onto the lower portion of the composite deep trench isolation structure after removing the upper portions of the first material; and
   forming a second material over the lower portion of the composite deep trench isolation structure to fill the trenches and form an upper portion of the composite deep trench isolation structure comprising the second material.

2. The method of claim 1, wherein the second material is also formed over the image sensing elements to form an upper isolation layer comprising the second material over the image sensing elements and over the composite deep trench isolation structure.

3. The method of claim 1, wherein the lower portion of the composite deep trench isolation structure has a thickness that is greater than 50 percent of a depth of the trenches.

4. The method of claim 1, wherein the first material has a higher reflectivity than the second material.

5. The method of claim 1, further comprising:
   removing portions of the barrier layer arranged on the upper surfaces of the image sensing elements; and
   forming the additional barrier layer over the lower portion of the composite deep trench isolation structure before removing the portions of the barrier layer arranged on the upper surfaces of the image sensing elements.

6. A method, comprising:
   forming a plurality of image sensing elements within a substrate;
   forming one or more interconnects along a first side of the substrate;
   selectively etching a second side the substrate to form sidewalls of the substrate that form one or more trenches extending within the substrate between the plurality of image sensing elements;
   forming a barrier on the sidewalls of the substrate and on the second side of the substrate;
   forming a metal within the one or more trenches and on the barrier;
   recessing the metal to below a top of the one or more trenches;

removing the barrier from the second side of the substrate after recessing the metal to below the top of the one or more trenches; and forming a dielectric within the one or more trenches and on the metal after recessing the metal.

7. The method of claim 6, wherein the barrier vertically extends from along sidewalls of the metal to vertically above a top of the metal after removing the barrier from the second side of the substrate.

8. The method of claim 6, further comprising:

forming a second barrier onto the metal and on the second side of the substrate after recessing the metal to below the top of the one or more trenches.

9. The method of claim 8, wherein the second barrier is also formed onto the barrier.

10. The method of claim 8, further comprising:

removing the barrier and the second barrier from the second side of the substrate after recessing the metal to below the top of the one or more trenches and prior to forming the dielectric within the one or more trenches.

11. The method of claim 8, wherein the barrier and the second barrier are removed from the second side of the substrate by a chemical mechanical polishing process.

12. The method of claim 6, further comprising:

forming a passivation layer on the sidewalls of the substrate and on the second side of the substrate; and forming the barrier onto the passivation layer.

13. The method of claim 6, further comprising:

removing the dielectric from the second side of the substrate, wherein the metal has a height that is larger than the dielectric after removing the dielectric from the second side of the substrate.

14. The method of claim 6, wherein the metal comprises copper.

15. A method, comprising:

forming a transistor device along a first side of a substrate;

forming one or more interconnects within an inter-level dielectric (ILD) structure disposed along the first side of the substrate;

selectively etching a second side the substrate to form sidewalls of the substrate that form one or more trenches extending within the substrate, the one or more trenches separating pixel regions within the substrate and the second side of the substrate opposing the first side of the substrate;

forming a passivation layer on the sidewalls of the substrate and on the second side of the substrate;

forming a barrier layer onto the passivation layer and along the second side of the substrate;

forming a first material within the one or more trenches, onto the barrier layer, and on the second side of the substrate;

recessing the first material, wherein the first material is recessed to below a top of the barrier layer;

removing the barrier layer from the second side of the substrate after recessing the first material;

forming a second material within the one or more trenches and on the first material after recessing the first material, wherein the first material has a higher reflectivity than the second material; and removing a part of the second material from the second side of the substrate.

16. The method of claim 15, wherein the first material comprises a metal and the second material comprises a dielectric.

17. The method of claim 15, wherein the passivation layer physically contacts the substrate along an interface extending to the second side of the substrate.

18. The method of claim 15, wherein the barrier layer comprises a sidewall that physically contacts a sidewall of the first material along an interface extending between bottommost and topmost surfaces of the first material.

19. The method of claim 15, wherein the passivation layer comprises a 'U' shape as viewed in a cross-sectional view.

20. The method of claim 15, wherein the first material comprises opposing outermost sidewalls that extend between a topmost and a bottommost surface of the first material as viewed in a cross-sectional view.

* * * * *